(12) United States Patent
Behar et al.

(10) Patent No.: US 11,551,414 B2
(45) Date of Patent: Jan. 10, 2023

(54) SIMULATION ARCHITECTURE FOR ON-VEHICLE TESTING AND VALIDATION

(71) Applicant: Woven Planet North America, INc., Los Altos, CA (US)

(72) Inventors: Erik Behar, Sunnyvale, CA (US); Jasper Fionn Friedrichs, Mountain View, CA (US); Shaojing Li, Mountain View, CA (US); Snow Li, Bellevue, WA (US); Thien Tran Vo, San Jose, CA (US); Jared Gregory Wood, San Jose, CA (US)

(73) Assignee: Woven Planet North America, Inc., Los Altos, CA (US)

( * ) Notice: Subject to any disclaimer, the term of this patent is extended or adjusted under 35 U.S.C. 154(b) by 244 days.

(21) Appl. No.: 16/700,914

(22) Filed: Dec. 2, 2019

(65) Prior Publication Data
US 2021/0166474 A1 Jun. 3, 2021

(51) Int. Cl.
*G01C 22/00* (2006.01)
*G05D 1/00* (2006.01)
(Continued)

(52) U.S. Cl.
CPC ........... *G06T 17/05* (2013.01); *G05D 1/0088* (2013.01); *G05D 1/0231* (2013.01); *G06T 19/20* (2013.01);
(Continued)

(58) Field of Classification Search
CPC ............... G05D 1/0088; G05D 1/0231; G05D 2201/0213; G06K 9/00791
(Continued)

(56) References Cited

U.S. PATENT DOCUMENTS

2016/0210382 A1  7/2016 Alaniz
2017/0132334 A1* 5/2017 Levinson ................ G06F 30/20
(Continued)

FOREIGN PATENT DOCUMENTS

KR         20190114496 A    10/2019
WO     WO 2017079229 A1     5/2017

OTHER PUBLICATIONS

International Search Report and Written Opinion for International Application No. PCT/US2020/062716, dated Mar. 15, 2021.

*Primary Examiner* — Mahmoud S Ismail
(74) *Attorney, Agent, or Firm* — Christopher G. Darrow; Darrow Mustafa PC

(57) ABSTRACT

In one embodiment, a computing system of a vehicle generates perception data based on sensor data captured by one or more sensors of the vehicle. The perception data includes one or more representations of physical objects in an environment associated with the vehicle. The computing system further determines simulated perception data that includes one or more representations of virtual objects within the environment and generates modified perception data based on the perception data and the simulated perception data. The modified perception data includes at least one of the one or more representations of physical objects and the one or more representations of virtual objects. The computing system further determines a path of travel for the vehicle based on the modified perception data, which includes the one or more representations of the virtual objects.

20 Claims, 13 Drawing Sheets

(51) Int. Cl.
    *G06T 17/05*     (2011.01)
    *G06T 19/20*     (2011.01)
    *G05D 1/02*     (2020.01)
    *G06V 20/56*     (2022.01)

(52) U.S. Cl.
    CPC ..... *G06V 20/56* (2022.01); *G05D 2201/0213* (2013.01)

(58) Field of Classification Search
    USPC .......................................................... 701/23
    See application file for complete search history.

(56) References Cited

U.S. PATENT DOCUMENTS

| | | | |
|---|---|---|---|
| 2017/0286570 A1* | 10/2017 | Kim | G06F 30/20 |
| 2019/0228571 A1 | 7/2019 | Atsmon | |
| 2020/0041997 A1* | 2/2020 | Tuukkanen | B60W 30/0956 |
| 2020/0065443 A1* | 2/2020 | Liu | H04W 4/44 |
| 2020/0339109 A1* | 10/2020 | Hong | G01S 13/86 |

\* cited by examiner

SIMULATION ARCHITECTURE FOR ON-VEHICLE TESTING AND VALIDATION

BACKGROUND

Autonomous and semi-autonomous vehicle technology allows the function of a human driver to be supplemented or replaced by computer driving systems. Given the safety-critical nature of the autonomous driving task, automated driving systems are to be thoroughly tested and validated under a wide range of possible driving scenarios. The testing and validation process, however, is costly, time consuming, potentially less safe, and disruptive to the development cycle. For example, each time after configuring or designing the automated driving system, the system is to be tested to ensure that the desired outcome has been achieved. If not, the system would then be reconfigured or redesigned and then tested again. Each of these tests may include a concerted effort by a team of personnel to properly set up, and repeated tests may warrant added precision in order to recreate consistent testing scenarios. While some testing may be carried out by software simulation, the test results may not supplement actual road tests due to, for example, potential differences between the simulated features and real-world features.

DESCRIPTION OF EXAMPLE EMBODIMENTS

Figure 1:
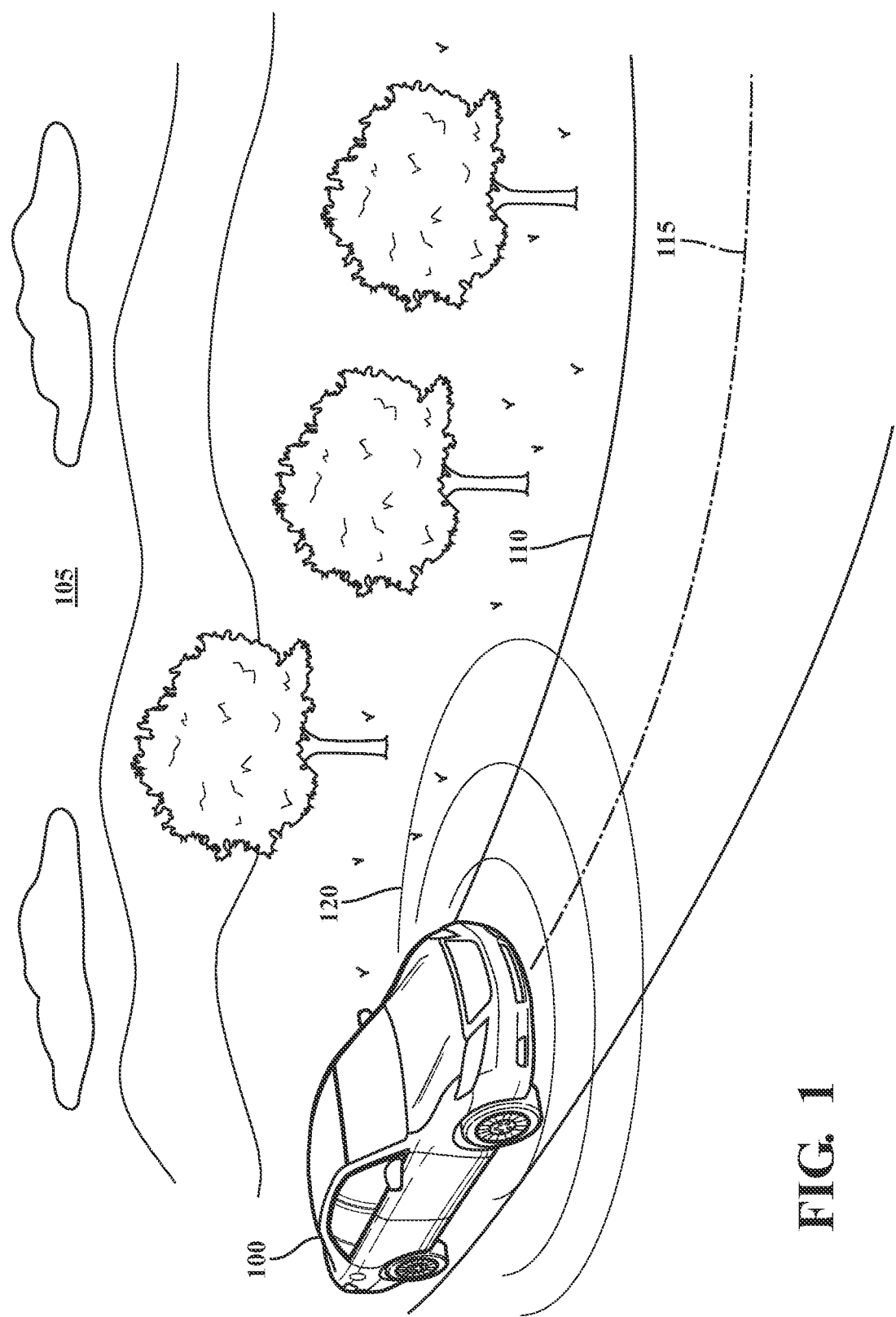
FIG. 1 illustrates an example autonomous or semi-autonomous vehicle test environment.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described. In addition, the embodiments disclosed herein are only examples, and the scope of this disclosure is not limited to them. Particular embodiments may include all, some, or none of the components, elements, features, functions, operations, or steps of the embodiments disclosed above. Embodiments according to the invention are in particular disclosed in the attached claims directed to a method, a storage medium, a system and a computer program product, wherein any feature mentioned in one claim category, e.g., method, can be claimed in another claim category, e.g., system, as well. The dependencies or references back in the attached claims are chosen for formal reasons only. However, any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

Disclosed herein are methods for performing live tests that include one or more on-board compute units of a vehicle processing and/or responding to simulated data (e.g., computer-mediated data) or a combination of both the simulated data and real-world data. In particular embodiments, the method allows characterization of autonomous or semi-autonomous vehicle behavior under highly-controlled conditions in the perceived environment. For example, some embodiments may use a scenario editor that allows a user to precisely specify one or more simulated events or agents to be perceived by the autonomous or semi-autonomous vehicle system. The simulated perception data may be injected into the vehicle's on-board data flow, being processed for prediction, planning, and control at each timestep of the simulation loop. By recording the behavior of the on-vehicle systems in response to the simulated perception data, inexpensive, repeatable, and precisely-controlled testing of autonomous or semi-autonomous vehicle software can be performed on the vehicle's hardware under realistic scenarios.

Autonomous or semi-autonomous driving systems include a complex, integrated suite of software and hardware that is responsible for the perception, planning, prediction, and control functionality associated with the navigation of the autonomous or semi-autonomous vehicle. Validating and testing the system to ensure that it complies with performance standards is an important task.

Creating scenarios and test cases that reflect the actual conditions that the system may experience during operation of a vehicle is aided by use of real-world tests. For example, fully validating and testing these hardware and software functionalities often include operating the vehicle in a real-world test environment and evaluating the software in real-time or near real-time. Typically, real-world physical tests include the real-world construction of complex scenarios, thereby becoming expensive and time consuming, especially in the case in which the real-world scenarios are to be set up precisely, safely, and consistently. For example, during the test, a vehicle would be operated on a real-world test course with obstacles or other objects placed, for example, in the travel path of the vehicle. The response or output of the software may then be recorded and compared against a specification or expected behavior. Testing in this manner presents two disadvantages: a) it is expensive in terms of time, labor, and material to operate on a real-world test course, and b) the course conditions often cannot be precisely and repeatably controlled. For example, to test the vehicle's emergency response capabilities, a testing scenario may call for an object to dart in front of a vehicle. To perform this test, the object is to be introduced in front of the vehicle at a prescribed moment, distance, and speed in reference to the vehicle. It would be costly and time-consuming to coordinate and carry out such a testing scenario. Moreover, the appropriate precision for carrying out the testing scenario may be difficult to achieve, especially at times in which the same scenario is to be consistently recreated to determine how differently-configured autonomous driving systems respond to the same conditions. The precise recreation of the test conditions allows for a true "apples-to-apples" comparison of different software and hardware module performance under the same, precise, and repeatable conditions.

An alternative to real-world tests is to run purely software simulations. For example, a simulation model may simulate how a virtual representation of the vehicle would operate under different virtual scenarios. Although software simulations may be performed relatively cheaply and quickly, it can be difficult to accurately simulate the real-world conditions and possible occurrences. Additionally, the accuracy of a pure software simulation is only as good as the accuracy of how well the simulation model parameterizes the real world. For example, a software simulation model may include parameterizing the vehicle's capabilities (e.g., tire traction, mechanical limitations, sensor ranges and features, field of view, signal delays due to bus length and noise, etc.), the vehicle's environment (e.g., sun position, weather, wind, humidity, surface conditions, etc.), and other agents in the environment (e.g., pedestrians, vehicles, animals, etc.), to name a few. Parameterizing every nuance of the relevant features of the real world is difficult, and real-world tests can provide insight into what is left out or inaccurately modeled. In addition, even if the software is able to accurately parameterize the vehicle's features at some point in time, any change in those features over time would cause the parameterized model of the vehicle to become less accurate.

In accordance with the present embodiments, to test the capability of an autonomous or semi-autonomous vehicle to respond to its environment, simulated sensor data may be injected directly into the vehicle's control system (e.g., at the frontend). In this manner, real-world sensor data from a real-world test can be replaced and/or supplemented by simulated sensor data (e.g., computer-mediated sensor data) that may be constructed beforehand to perform a live test of the vehicle's performance and capabilities under various testing scenarios. For example, the simulated sensor data may be constructed and triggered to match precise specifications, allowing for far greater degree of control over the testing scenario, and thereby allowing a greater range of test cases and a greater capacity for ensuring the robustness of the vehicle's performance and capabilities.

In certain embodiments, the software architecture, hardware architecture, or some combination of software and hardware architecture of an autonomous or semi-autonomous vehicle include a control system. For example, the control system may include one or more components and/or subcomponents associated with various aspects of autonomous and/or semi-autonomous driving tasks. In some embodiments, the control system may interface with one or more sensor devices (e.g., temperature sensors, pressure sensors, speed sensors, acceleration sensors, fuel sensors, level sensors, flow sensors, optical sensors, torque sensors, motion sensors, vapor sensors, humidity sensors, stress sensors, strain sensors, load sensors, orientation sensors, altitude sensors, displacement sensors, position sensors, condensation sensors, and so forth), image-capturing devices (e.g., cameras, scanners, ultrasonic imaging devices, thermal imaging devices, electromagnetic imaging devices, and so forth), and/or various other devices that may detect data or receive data (e.g., over a network) at the vehicle. The control system may then process and analyze the various data and determine one or more control actions to be performed by the vehicle in anticipation of, and/or in response to, potential objects and other information associated with the data and additional mapping information. The control system may then provide one or more outputs to cause the vehicle to perform the determined control actions.

As used herein, a "live test" may refer to any testing, validation, or performance processes for an autonomous or semi-autonomous vehicle in which the testing, validation, or performance processes are conducted in real-time or near real-time within an environment, such that the vehicle's actual response and/or expected response to any possible encounter of a human, an agent, an object, or other potential obstruction in the travel path or in the environment surrounding the vehicle during operation is recorded, repeated, and optimized without any human, agent, object, potential obstruction, or the vehicle itself being subjected to a precarious circumstance. Furthermore, as used herein, a "live test" may refer to any testing, validation, or performance processes for an autonomous or semi-autonomous vehicle in which the testing, validation, or performance processes are performed by one or more on-board compute units of a vehicle processing and/or responding to simulated data (e.g., computer-mediated sensor data, computer-mediated perception data, computer-mediated prediction data, computer-mediated planning data, computer-mediated teleoperator data, and so forth) or at least some combination of both the simulated data and real-world data (e.g., real-world sensor data, real-world perception data, real-world prediction data, real-world planning data, real-world teleoperator data, and so forth).

With the forgoing in mind, it may be useful to describe an example of a real-world test of an autonomous or semi-autonomous vehicle 100, as illustrated, for example, by FIG. 1. As depicted in FIG. 1, the vehicle 100 may be in motion within a test environment 105. The test environment 105 may include, for example, a test course 110 along which the test vehicle 100 has a trajectory 115. In some embodiments, the trajectory 115 may be predetermined according to the objective of the test, and thus the trajectory 115 may pass through obstacles or cause the vehicle 100 to encounter various entities including, for example, other vehicles, curbs, debris, objects, or any of various potential moving and/or stationary obstructions.

In some embodiments, as the vehicle 100 is being tested along the test course 110, real-world sensor data may be acquired via one or more on-board sensors installed on the vehicle 100. Such sensor data may be acquired from sensor emissions, which may provide the vehicle 100 a finite local sphere of perception 120. An example of a sensor emission would be laser light from Light Detection and Ranging (LiDAR) sensors. For example, as the vehicle 100 moves along the test course 110, various objects may potentially pass into or out of the sphere of perception 120. Thus, as will be further appreciated with respect to FIGS. 2A-2F and FIGS. 3-6, in some instances, it may be desirable that one or more entities be added to the test course 110 to produce a more exhaustive range of testing conditions (e.g., corresponding to one or more potential real-world scenarios the vehicle may encounter during real-world operation). It may further be desirable that the behavior of such entities be reproducible and precisely controllable, and, still further, that the expense of physically creating these entities be avoided.

Figure 2A:
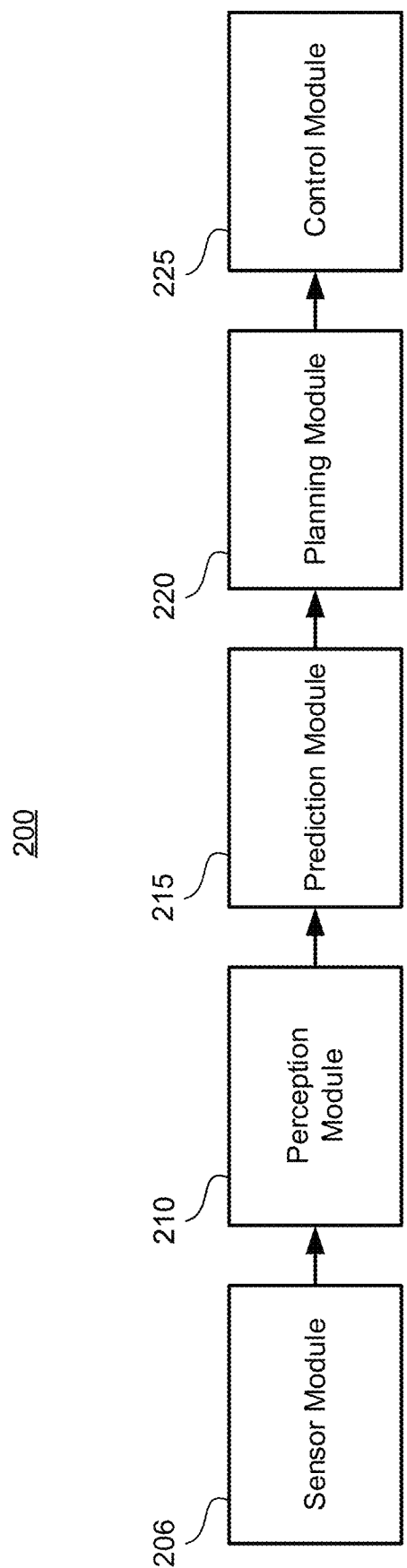
FIG. 2A illustrates an example block diagram for a control system.

Turning now to FIGS. 2A-2F, which illustrate various example block diagrams of control systems that may be useful in performing live tests via one or more on-board compute units of a vehicle processing and/or responding to simulated data (e.g., computer-mediated data) or some combination of both the simulated data and real-world data. For example, as depicted by FIG. 2A, in some embodiments, an autonomous and/or semi-autonomous control system 200 may include a number of computing modules, such as a sensor data module 205, perception module 210, prediction module 215, planning module 220, and control module 225. Sensor data module 205 may obtain and pre-process sensor/telemetry data that is provided to perception module 210. Such data may be captured by any suitable sensors of a vehicle.

As an example, and not by way of limitation, the vehicle 100 may include a LiDAR sensor that is configured to transmit pulsed laser beams in multiple directions and measure the reflected signal from objects surrounding the vehicle 100. The time of flight (ToF) of the light signals may be used to measure the distance or depth of the objects from the LiDAR. As another example, the vehicle 100 may include optical cameras pointing in different directions to capture images (e.g., still images, video images) of the surrounding of the vehicle 100. Radars may also be used by the vehicle 100 for detecting other vehicles and/or other potential obstructions at a distance. As further examples, the vehicle 100 may be equipped with, for example, one or more ultrasonic sensors, electromagnetic imaging sensors, or thermal imaging sensors for close range object detection (e.g., parking and obstacle detection). The vehicle 100 may further include one or more infrared cameras for object detection when operating within, for example, low-lighting and/or dark locations. In particular embodiments, sensor data module 205 may suppress noise in the sensor data or normalize the sensor data. The sensor module 206 may be configured to receive sensor information from any suitable sensors and/or modules configured to sense information from the environment surrounding the vehicle 100.

Perception module 210 is responsible for correlating and fusing the data from the different types of sensors of the sensor module 205 to model the contextual environment of the vehicle 100. Perception module 210 may use information extracted by multiple independent sensors to provide information that would not be available from any single type of sensors. Combining data from multiple sensor types allows the perception module 210 to leverage the strengths of different sensors and more accurately and precisely perceive the environment. As an example, and not by way of limitation, image-based object recognition may not work well in low-light conditions. This may be compensated by sensor data from LiDAR or radar, which are effective sensors for measuring distances to targets in low-light conditions. As another example, image-based object recognition may mistakenly determine that an object depicted in a poster is an actual three-dimensional (3-D) object in the environment. However, if depth information from a LiDAR is also available, the perception module 210 may utilize that additional information to correctly determine that the object in the poster is actually a two-dimensional (2-D) object, for example.

Perception module 210 may process the available data (e.g., sensor data, data from a high-definition map, etc.) to derive information about the contextual environment. For example, perception module 210 may include one or more agent modelers (e.g., object detectors, object classifiers, or machine-learning models trained to derive information from the sensor data) to detect and/or classify agents present in the environment of the vehicle 100 (e.g., other vehicles, pedestrians, bicyclists, wildlife, vegetation, or any of various other potential moving and/or stationary obstructions). Perception module 210 may also determine various characteristics of the agents. For example, perception module 210 may track the velocities, moving directions, accelerations, trajectories, relative distances, or relative positions of these agents. In particular embodiments, the perception module 210 may also leverage information from a high-definition map. The high-definition map may include a precise 3-D model of the environment, including buildings, curbs, street signs, traffic lights, and any stationary fixtures in the environment. Using the vehicle's GPS data and/or image-based localization techniques (e.g., simultaneous localization and mapping, or SLAM), the perception module 210 may determine the pose (e.g., position and orientation) of the vehicle 100 or the poses of the vehicle's sensors within the high-definition map. The pose information, in turn, may be used by the perception module 210 to query the high-definition map and determine what objects are expected to be in the environment.

Perception module 210 may use the sensor data from one or more types of sensors and/or information derived therefrom to generate a representation of the contextual environment of the vehicle 100. As an example, and not by way of limitation, the representation of the external environment may include objects such as other vehicles, curbs, debris, objects, and pedestrians. The contextual representation may be limited to a maximum range of the sensor array (e.g., 50 meters, 100 meters, or 200 meters) or may be supplemented by information obtained from other sensors in the environment, semantic information known about an area, and/or any other relevant information regardless of the range of the sensor array. The representation of the contextual environment may include information about the agents and objects surrounding the vehicle 100, as well as semantic information about the traffic lanes, traffic rules, traffic signs, time of day, weather, and/or any other suitable information. The contextual environment may be represented in any suitable manner. As an example, and not by way of limitation, the contextual representation may be encoded as a vector or matrix of numerical values, with each value in the vector/matrix corresponding to a predetermined category of information.

For example, each agent in the environment may be represented by a sequence of values, starting with the agent's coordinate, classification (e.g., vehicle, pedestrian, etc.), orientation, velocity, trajectory, and so on. Alternatively, information about the contextual environment may be represented by a raster image that visually depicts the agent, semantic information, etc. For example, the raster image may be rendered as a birds-eye view of the vehicle and its surrounding, up to, for example, a predetermined distance. In some embodiments, the raster image may include visually encoded information (e.g., bounding boxes, color-coded shapes, etc.) that represent various data and objects of interest (e.g., vehicles, pedestrians, lanes, buildings, etc.). Any number of different renderings and/or outputs of the perception information may be implemented in different embodiments including object lists with relevant motion information, 3-D point clouds, and/or any other suitable format as one of ordinary skill in the art would recognize.

The representation of the present contextual environment from the perception module 210 may be consumed by a prediction module 215 to generate one or more predictions of the future environment. For example, given a representation of the contextual environment at time $t_0$, the prediction module 215 may output another contextual representation for time $t_1$. For instance, if the $t_0$ contextual environment is represented by a raster image, the output of the prediction module 215 may be another raster image (e.g., a snapshot of the current environment) that depicts where the agents would be at time $t_1$ (e.g., a snapshot of the predicted future). In particular embodiments, prediction module 215 may include a machine-learning model (e.g., a convolutional neural network, a neural network, a decision tree, support vector machines, etc.) that may be trained based on previously recorded contextual and sensor data.

For example, one training sample may be generated based on a sequence of actual sensor data captured by a vehicle at times $t_0$ and $t_1$. The captured data at times $t_0$ and $t_1$ may be used to generate, respectively, a first contextual representation (the training data) and a second contextual representation (the associated ground-truth used for training). During training, the machine-learning model may process the first contextual representation using the model's current configuration parameters and output a predicted contextual representation. The predicted contextual representation may then be compared to the known second contextual representation (i.e., the ground-truth at time $t_1$).

In certain embodiments, the comparison may be quantified by a loss value, computed using a loss function. The loss value may be used (e.g., via back-propagation techniques) to update the configuration parameters of the machine-learning model so that the loss would be less if the prediction were to be made again. The machine-learning model may be trained iteratively using a large set of training samples until a convergence or termination condition is met. For example, training may terminate when the loss value is below a predetermined threshold. Once trained, the machine-learning model may be used to generate predictions of future contextual representations based on current contextual representations. The prediction module 215 may use any combination of rule-based and machine-learning based models may be used along with mechanics models for characterizing the movement of objects over time in order to predict the probabilities of different paths, types of movement, actions, etc. over different time periods for use by the system for prediction the movements of objects surrounding the driving control system of the vehicle 100.

Planning module 220 may determine the navigation routes and particular driving operations (e.g., slowing down, speeding up, stopping, swerving, etc.) of the vehicle 100 based on the predicted contextual representation generated by the prediction module 215. In particular embodiments, the planning module 220 may utilize the predicted information encoded within the predicted contextual representation (e.g., predicted location or trajectory of agents, semantic data, etc.) and any other available information (e.g., map data, scenario information, traffic data, accident reports, weather reports, target destinations, and any other suitable information) to determine one or more actions, goals, or navigation instructions for the vehicle 100. As an example, and not by way of limitation, based on the predicted behavior of the agents surrounding the vehicle and the traffic data to a particular destination, the planning module 220 may determine a particular navigation path and associated driving operations for the vehicle 100 over a window of time. The path may include a series of waypoints and/or any other suitable set of information for the vehicle 100 to understand the path of movement to following. The path and associated driving operations are generated to avoid possible collisions with one or more agents, to follow the rules of the road, and to ensure a safe and comfortable ride for the passengers of the vehicle 100.

In particular embodiments, planning module 220 may generate, based on a given predicted contextual presentation, several different plans (e.g., goals or navigation instructions) for the vehicle 100. For each plan, the planning module 220 may compute a score that represents the desirability of that plan. For example, if the plan would likely result in the vehicle 100 performing a hard stop or otherwise performing an uncomfortable or jarring movement the score for the plan may be penalized accordingly. Another plan that would cause the vehicle 100 to violate traffic rules or take a lengthy detour to avoid possible collisions may also have a score that is penalized, but the penalty may be less severe than the penalty applied. The penalties and scoring of the different potential routes may ensure safe and comfortable paths are generated and selected by the system. For example, a third plan that causes the vehicle 100 to gradually stop or change lanes to avoid an agent in the predicted future may receive the highest score compared to paths with jarring movements and/or an increased chance of a collision event. Based on the assigned scores for the plans, the planning module 220 may select the best plan to carry out. While the example above used collision as an example, the disclosure herein contemplates the use of any suitable scoring criterial, such as travel distance or time, fuel economy, changes to the estimated time of arrival at the destination, passenger comfort, proximity to other vehicles, the confidence score associated with the predicted contextual representation, etc.

Based on the plan generated by planning module 220, which may include one or more navigation path or associated driving operations, control module 225 may determine the specific commands to be issued to the actuators of the vehicle 100. The actuators of the vehicle 100 are components that are responsible for moving and controlling the vehicle 100. The actuators control driving functions of the vehicle 100, such as for example, steering, turn signals, throttle, deceleration (braking), acceleration, gear shift, etc. As an example, and not by way of limitation, control module 225 may transmit commands to a steering actuator to maintain a particular steering angle for a particular amount of time to move a vehicle on a particular trajectory. As another example, control module 225 may transmit commands to a throttle actuator to speed the vehicle 100 up or a braking actuator to slow the vehicle 100 down.

Figure 2B:
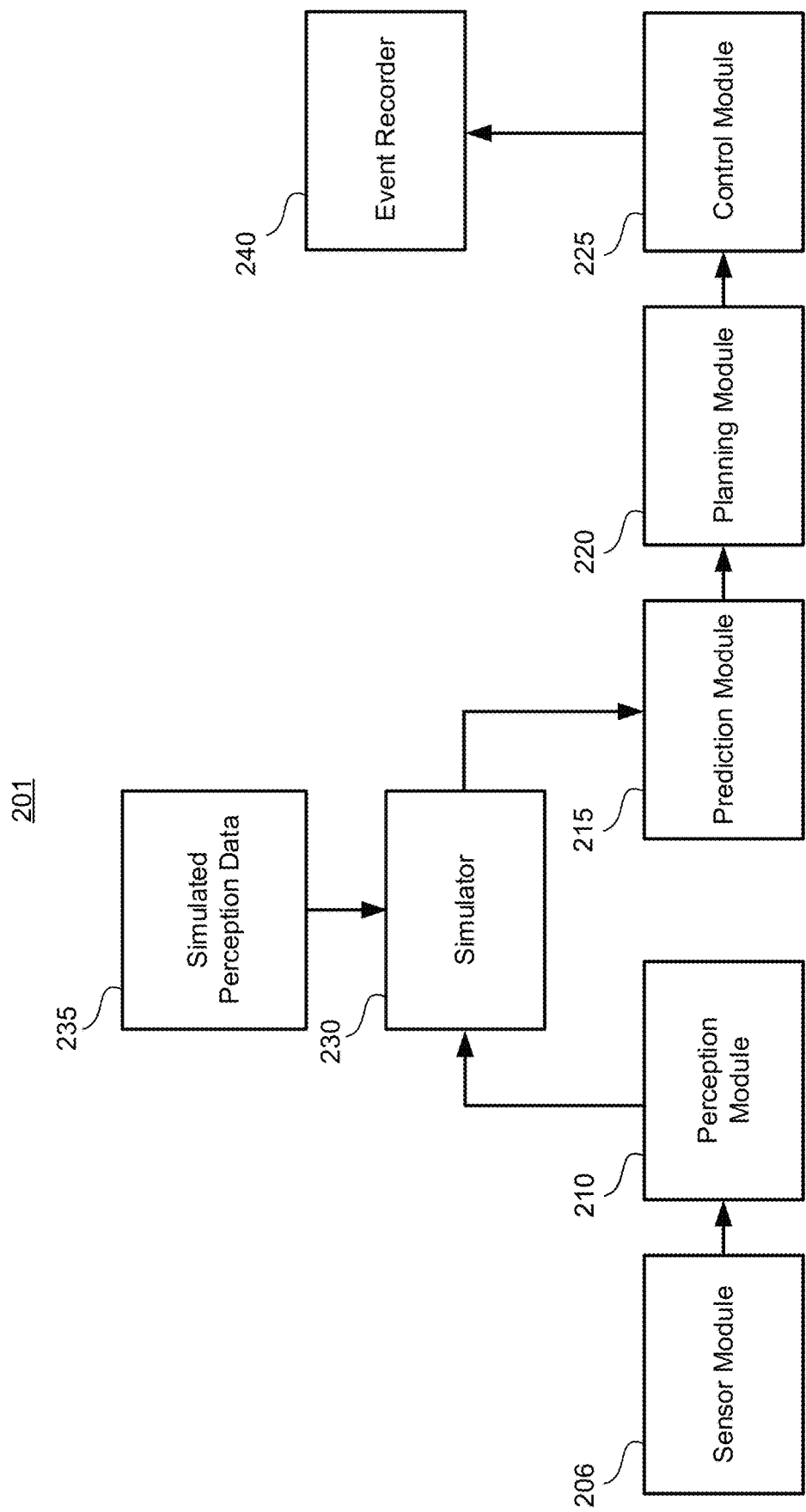
FIG. 2B illustrates an example block diagram for a modified control system with a simulator module for injecting simulated perception data.

FIG. 2B illustrates an example block diagram showing a modified control system 201 that an autonomous or semi-autonomous vehicle may execute during testing. In particular embodiments, the output of the perception module 210, rather than being directly input into the prediction module 215, serves as an input to a simulator 230. The simulator 230 may additionally access simulated perception data 235 that is to be injected into the control system 201. Based on the simulated perception data 235 and the output from the perception module 210 that the sensor module 206 actually-perceived, the simulator 230 generates data describing a simulated contextual environment of the vehicle. Such data may or may not represent the actual environment of the vehicle 100. The data output by the simulator 230 may include descriptions of high-level entities that are present in the physical environment, such as physical objects, agents, other vehicles, curbs, debris, and pedestrians. The data output by the simulator 230 may further include one or more virtual entities that the vehicle testers wish to inject into the simulated contextual environment. The simulator-generated data may additionally describe the behavior of those virtual entities and associate those behaviors to one or more states of the virtual entities, with each state associated to one or more points in time.

The data output by the simulator 230 may include a combination of data from the perception module 210 and the simulated perception data 235. The simulator may combine the perception module output with the simulated perception data 235 to create a mixed-reality contextual data for the prediction module 215 to consume. The simulated perception data 235 can be of the same format as the data generated by the perception module to simplify the process of combining the two. For example, both data sets nay adhere to the same XML schema or any other data format that is commonly agreed upon.

Alternatively, the simulated perception data 235 may provide instructions to the simulator 230 to specify how the data from the perception module 210 should be modified. For example, the simulated perception data 235 may instruct the simulator 230 to inject data corresponding to a simulated bicyclist into the data from the perception module 210. The simulator 230 is tasked with generating contextual environment data that is indistinguishable from data output by the perception module 210. In this manner, the contextual environment data containing simulated data has the same effect as data originating from the perception module 210 and is processed in the same way by the prediction module 215. Thus, live tests can be augmented with simulator-generated environment features that are difficult or costly to reproduce physically. In another embodiment, the simulated perception data 235 may include, for example, various aspects of object identification, labeling, and precise tracking to further isolate and granularly analyze the perception data from the perception module 210 and/or the simulated perception data 235.

In particular embodiments, the simulator 230 may provide simulated data to the prediction module 215 without using any data from the perception module 210. For example, simulated perception data 235 may not be combined with the output of the perception module 210, but may, at least in some embodiments, be the sole input for determining what the simulator 230 would output. The previously discussed approach of combining simulated data (e.g., computer-mediated data) with actually-perceived data (e.g., real-world data) has the benefit of allowing the vehicle 100 to still perceive the actual world during road tests, thereby allowing the vehicle to react to real-world conditions (e.g., the vehicle may react to an unexpected hazard, such as a darting animal or other possible unforeseeable obstruction).

However, for certain tests, it may be desirable to have the testing scenario be completely simulated, including the roads, trees, lighting, and anything else that is perceptible. For example, in certain tests, the goal may be to test how the vehicle with different software or hardware configurations would behave under the exact same testing scenario. In that case, the same exact simulated perception data 235 may be repeatedly used in multiple test runs without using any of the data from the perception module 210 (e.g., the actually-perceived data is disregarded). The simulated perception data 235 that is repeatedly used may originally be the recorded perception output from the perception module 210. For example, after one test run, the data from the perception module 210 may be recorded. In subsequent tests, the recorded data may be injected as the simulated perception data 235, thus allowing the test vehicle 100 to operate under the same exact simulated conditions. In this manner, the input to the prediction module 215 may, in some embodiments, be entirely constructed based on the simulated perception data 235, thus allowing the control system 201 to operate on input data that is entirely simulated. This allows the perceived contextual vehicle environment to be entirely different from the actual contextual environment of the vehicle, in turn allowing the control system 201 to be tested and validated entirely in simulation.

In particular embodiments, the simulated perception data 235 may be generated by a scenario editor. The scenario editor may include a user interface through which a user can create, modify, insert, or remove various entities from data describing a vehicle contextual environment. For example, the scenario editor may allow a user to specify a particular type of simulated object (e.g., a pedestrian, an oncoming vehicle, a tree, a bicyclist, etc.) to inject into the contextual environment data. Through the scenario editor, the user may specify a position, orientation, velocity, appearance, size, mass, and any other attribute for the simulated object. The simulated object may also be programmed to enter the scene in a particular way at a particular instance in time. For example, a bicyclist may possibly swerve into the test vehicle's lane at a particular instance in time. The scenario editor may also allow the user to add logic (e.g., via software, hardware, or some combination of software and hardware) to control how the simulated object behaves. For example, a simulated bicyclist may be programmed, for example, to swerve into the test vehicle's lane when the test vehicle 100 and simulated bicyclist are separated by a threshold distance. In this example, the simulated bicyclist may then, for example, swerve back into the bike lane when the test vehicle 100 slows down. Thus, as should be appreciated, the simulated perception data 235 may be obtained based on, for example, a scenario editor, a derivation from previously perceived perception data obtained from the vehicle 100 or a fleet of similar vehicles, or the simulated perception data 235 may be received at the vehicle 100 via a communications network or other distributed network.

In particular embodiments, a test of the control system 201 may be logged and recorded using an event recorder 240. The event recorder may be used to correlate output of the control module 240, or any other module (e.g., the sensor module 206, perception module 210, prediction module 215, and planning module 220) of the control system 201 either alone or in combination. The output of the control system 201 may be used by the event recorder 240 to correlate events in the control history of the vehicle to events in the simulated contextual environment. Alternatively, events in the control history may be correlated to the events in the actual or perceived contextual environment in combination with the simulated contextual environment.

Figure 2C:
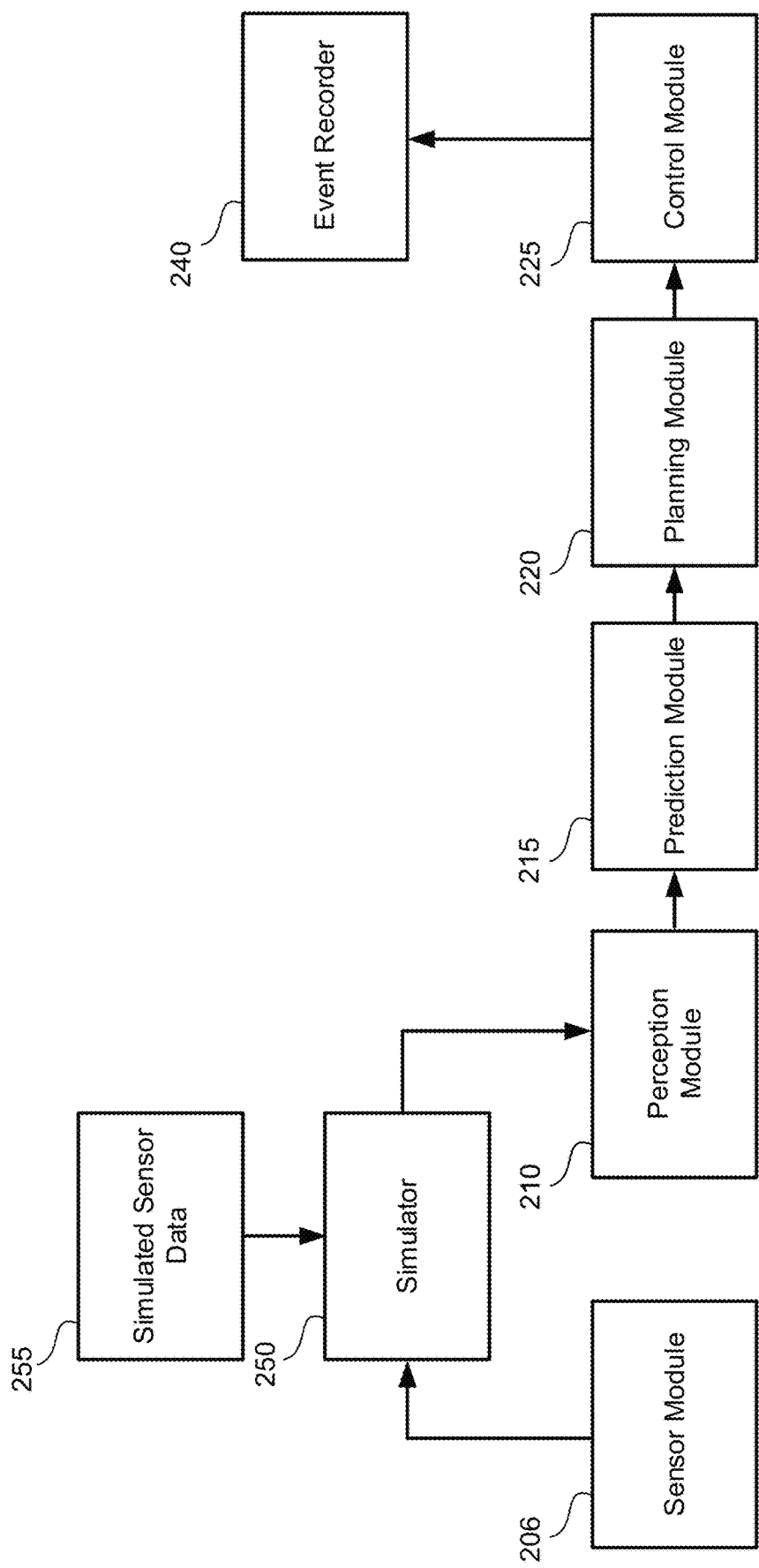
FIG. 2C illustrates an example block diagram for a modified control system with a simulator module for injecting simulated sensor data.

FIG. 2C illustrates an example block diagram showing a modified control system 202 that an autonomous or semi-autonomous vehicle may execute during testing. The previously described embodiment shown in FIG. 2A injects simulated data into the prediction module 215. In that embodiment, the goal is to test the prediction module 215 and the subsequent modules in the control system 201. In FIG. 2B, on the other hand, simulated data is injected into the perception module 210 to test the perception module 210, as well as potentially any of the subsequent modules in the control system 202. Rather than obtaining sensor data from the sensor module 206 directly, for example, the perception module 210 may, at least in some embodiments, obtain its input from a simulator 250.

The simulator 250 may be tasked with generating sensor data for consumption by the perception module 210. In particular embodiments, the simulator 250 may generate its output based on both sensor data from the sensor module 206 and simulated sensor data 255, which may, for example, be generated by a scenario editor or based on a previously recorded output of the sensor module 206. The sensor data from the sensor module 206 may include, for example, images, lidar data, radar data, sonar data, accelerometer data, gyroscope data, inertial measurement unit data, and any other types of sensor data used by the vehicle to understand its surrounding. The sensor data may also include, for example, one or more derived representations of raw sensor data from the sensors. For example, in some embodiments, the sensor data may include a point cloud or depth map generated using the lidar data and/or stereo camera data. Thus, as should be appreciated, the simulated sensor data 255 may be obtained based on, for example, a scenario editor, a derivation from previously perceived sensor data obtained from the vehicle 100 or a fleet of similar vehicles, or the simulated sensor data 255 may be received at the vehicle 100 via a communications network or other distributed network.

As further depicted in FIG. 2C, the simulated sensor data 255 may include any type of sensor data of interest, including, for example, the same type of sensor data that the sensor module 206 may generate. For example, the simulated sensor data 255 may be derived from pre-recorded data from actual sensors, modified data from actual sensors, or purely fabricated data. The simulated sensor data 255 may be processed by the simulator 250 and combined with data from the sensor module 206. Alternatively, the simulator 250 may generate an output based solely on the simulated sensor data 255. The output of the simulator 250 may then be provided to the perception module 210 for processing.

Providing techniques to inject simulated sensor data 255 into the vehicle's control system 202 has several benefits. For example, even if the test vehicle is not equipped with a particular type or model of a sensor, the presently disclosed embodiments may allow tests to be carried out by using simulated sensor data that is expected to be generated by that sensor. This allows the testing to be carried out without having to wait for a particular type of sensor, for example, to become available. Especially due to the cost of high-end sensors used for autonomous driving, this allows developers of autonomous or semi-autonomous driving technology to test suitability (e.g., "try out") of various sensors before physically installing or implementing any particular one. In a similar manner, different sensor configurations may be tested. For example, rather having to physically alter a camera's settings or mounting location, a test vehicle 100 may operate according to simulated sensor data 255 that corresponds to the candidate settings or mounting locations. The simulator 250 provides test engineers the flexibility to have total control (e.g., utilizing the control system 200, 201, 202, 203, 204, 205, or some combination thereof) over the sensor data that is supplied to the perception module 210, thereby allowing the perception module 210 to be tested irrespective of the sensor module 206.

Figure 2D:
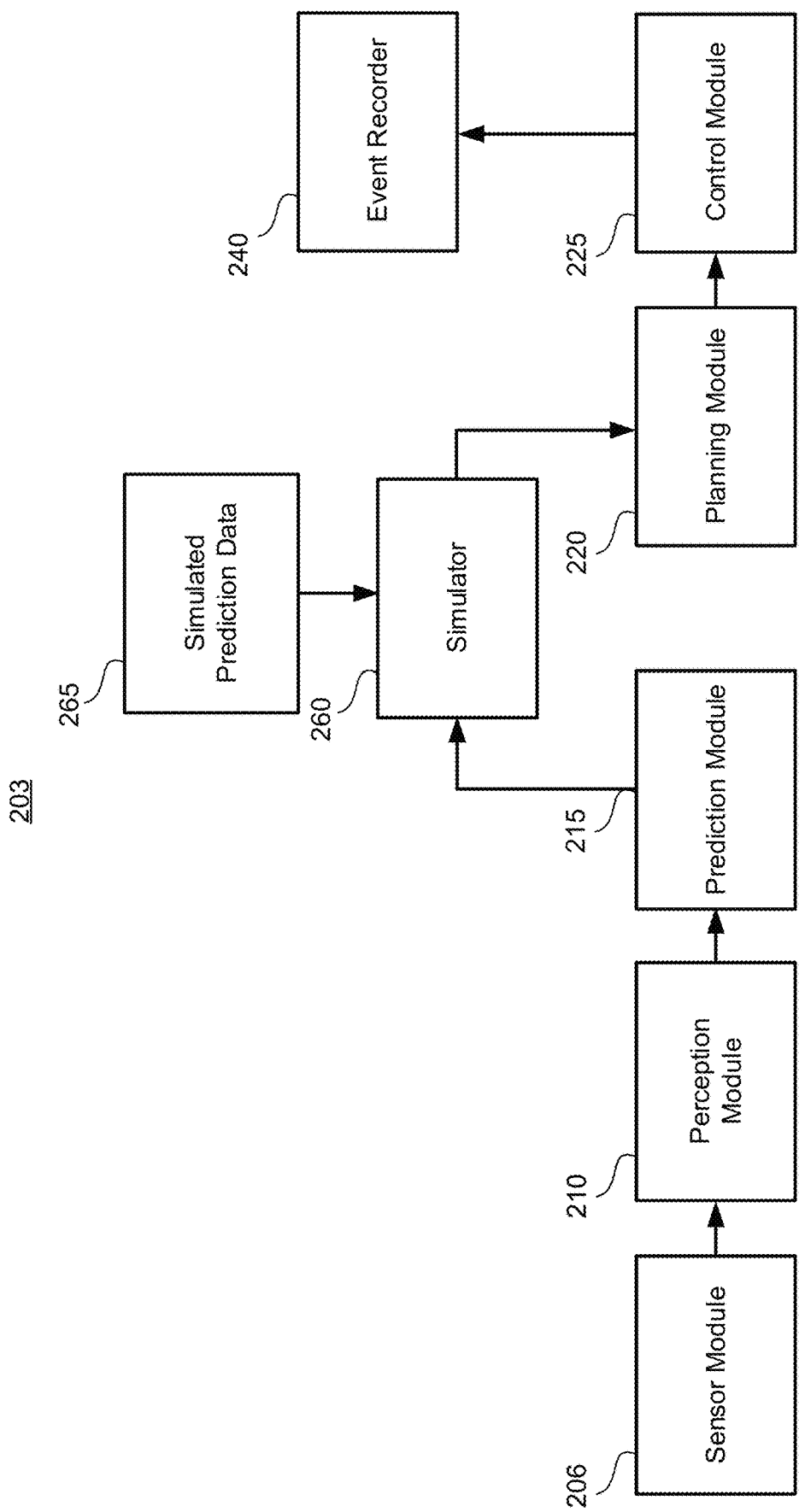
FIG. 2D illustrates an example block diagram for modified control system with a simulator module for injecting simulated prediction data.

FIG. 2D illustrates an example block diagram showing another modified control system 203 that an autonomous or semi-autonomous vehicle may execute during testing. In FIG. 2D, simulated data is injected into the planning module 220, thereby allowing the planning module 220 to be the focus of the tests, as well as potentially any of the subsequent modules in the control system 203. Rather than obtaining prediction data from the prediction module 215 directly, for example, the planning module 220 may obtain its input from a simulator 260. The simulator 260 may be tasked with generating prediction data for consumption by the planning module 220.

In particular embodiments, the simulator 260 may generate its output based on both prediction data from the prediction module 215 and simulated prediction data 265, which may be generated, for example, by a scenario editor or based on a previously recorded output of the prediction module. The prediction data from the prediction module 215 may include, for example, a predicted representation of the contextual environment at a future point in time. For example, the prediction module 215 may predict where a perceived pedestrian or other moving and/or stationary obstructions would be in a next instance in time (e.g., after one or more seconds elapse) or a next few instances in time. The simulated prediction data 265 may be in the same format as the data output by the prediction module 215. As such, the simulated prediction data 265 may be consumed, for example, directly by the planning module 220 without data from the prediction module 215. If the simulated prediction data 265 is to be combined with the output from the prediction module 215, the simulator 260 may do so to generate a final output that may be consumed by the planning module 220.

For example, the simulated prediction data 265 may inject a predicted position of a bicyclist or other potential moving and/or stationary obstruction into the prediction output by the prediction module 215. For example, the simulator 260 may output a final output that includes the prediction made by the prediction module 215 in conjunction with, for example, the bicyclist at its designated position. This final output may then be consumed by the planning module 220 to allow the test vehicle 100 to plan how to respond to the given prediction (part of which is simulated). In particular embodiments, the simulated prediction data 265 may be instructions on how to modify the prediction module 215. For example, if the prediction module 215 indicates that a bicyclist or other potential moving obstruction is likely to stay in its lane, the simulated prediction data 265 may nevertheless ask the simulator 260 to alter that prediction and have the bicyclist, for example, repositioned by a predetermined distance. This may result in bicyclist entering the lane of the test vehicle 100. Thus, as should be appreciated, the simulated prediction data 265 may be obtained based on, for example, a scenario editor, a derivation from previously perceived prediction data obtained from the vehicle 100 or a fleet of similar vehicles, or the simulated prediction data 265 may be received at the vehicle 100 via a communications network or other distributed network.

Providing techniques to inject simulated prediction data 265 into the vehicle's control system 203 has several benefits. Like with the various injection points described with reference to FIGS. 2A-2F, injecting the prediction data 265 at a particular stage in the control system 203 allows the subsequent modules to be isolated for testing. This capability is especially valuable for testing the planning module 220, since the prediction output from the prediction module 215 is less predictable given the nature of predictive algorithms and machine-learning models. Specifically, by providing techniques to inject simulated prediction data 265 into the planning module 220, the presently disclosed embodiments may allow test engineers may more precisely control (e.g., utilizing the control system 200, 201, 202, 203, 204, 205, or some combination thereof) how the planning module 220 is tested. For example, without simulated prediction data 265, the output from the prediction module 215 may not produce the desired testing parameters and/or results. For instance, for a particular scenario, the test engineers may desire to test how the planning module 220 would respond to a prediction that a bicyclist or other potential moving obstruction were to unexpectedly swerve into the lane of the test vehicle 100.

However, given that this particular prediction scenario involves an unexpected event, the prediction module 215 may not generate the desired prediction for purposes of the test. Rather than finding ways to update the physical test setup to have the prediction module 215 generate the desired test case, the presently disclosed techniques may allow the test engineers (e.g., utilizing the control system 200, 201, 202, 203, 204, 205, or some combination thereof) to simply generate simulated prediction data 265 and inject into the control system 203 so that the planning module 220 may be tested. Thus, even if the prediction module 215 is not generating the desired prediction (regardless of it being due to the physical test setup, issues with the sensor module 206, perception module 210, or prediction module 215), the planning module 220 may be tested.

Figure 2E:
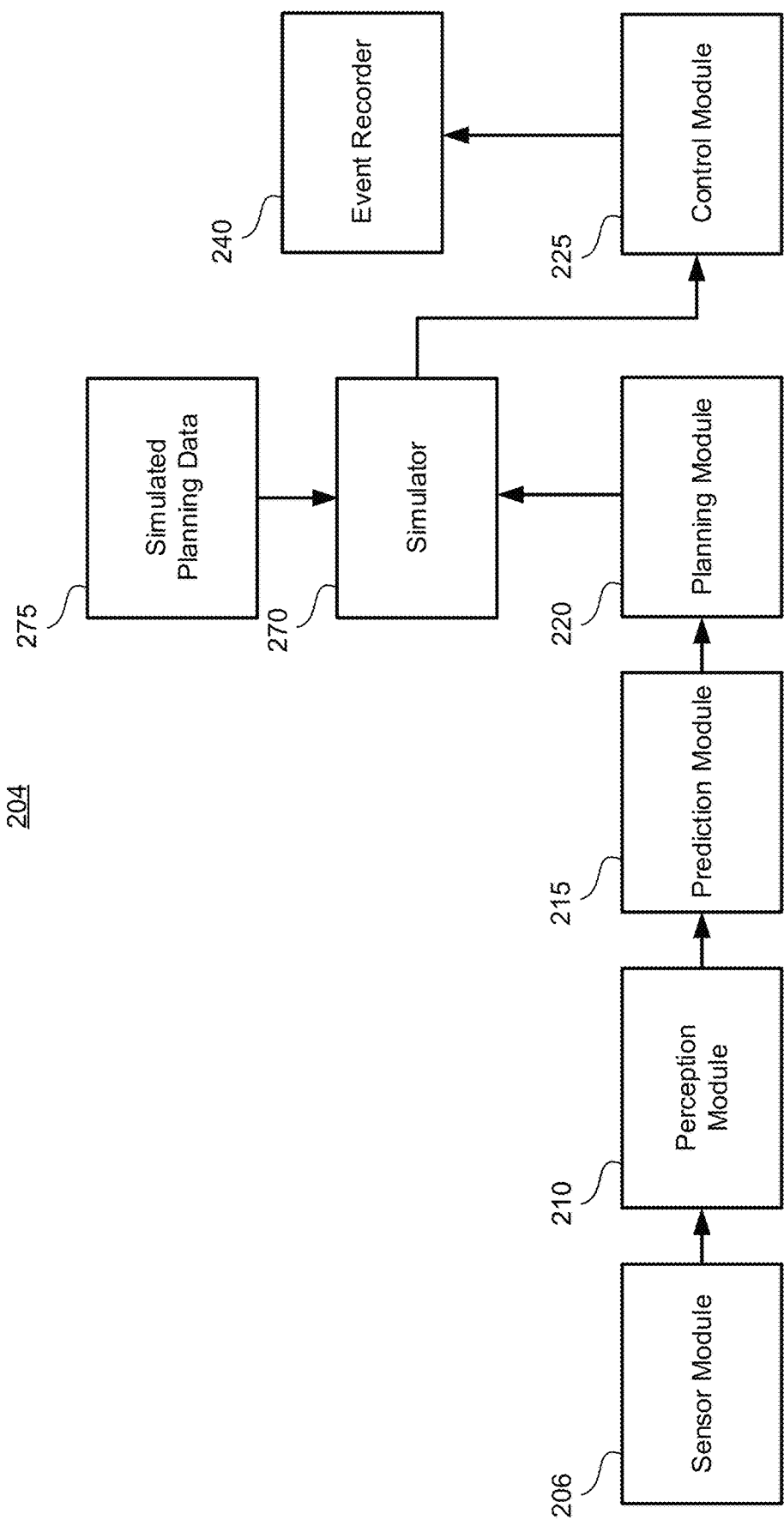
FIG. 2E illustrates an example block diagram for modified control system with a simulator module for injecting simulated planning data.

FIG. 2E illustrates an example block diagram showing another modified control system 204 that an autonomous or semi-autonomous vehicle may execute during testing. In FIG. 2E, simulated data is injected into the control module 225, thereby allowing the control module 225 to be the focus of the tests, as well as potentially any other subsequent modules in the control system 204. Rather than obtaining planning data from the planning module 220 directly, for example, the control module 225 may obtain its input from a simulator 270.

The simulator 270 may be tasked with generating planning data for consumption by the control module 225. In particular embodiments, the simulator 270 may generate its output based on both planning data from the planning module 220 and simulated planning data 275, which may be generated by a scenario editor or based on a previously recorded output of the planning module 220. The planning data from the planning module 220 may include a planned course of action for the vehicle. For example, the planning module 220 may generate a plan for the vehicle to slow down to avoid being too close to a predicted position of, for example, a bicyclist or other potential moving and/or stationary obstruction. The simulated planning data 275 may be in the same format as the data output by the planning module 220. As such, the simulated planning data 275 may be consumed, for example, directly by the control module 225 without data from the planning module 220. If the simulated planning data 275 is to be combined with the output from the planning module 220, the simulator 270 may do so to generate a final output that may be consumed by the control module 225.

In particular embodiments, the simulated planning data 275 may be instructions on how to modify the output from the planning module 220. For example, the simulated planning data 275 may specify that the test vehicle 100 should veer left in addition to the planning module's 220 plan of simply slowing down to avoid a bicyclist. In another embodiment, the simulated planning data 275 may include, for example, an environmental model, a trajectory or alternative travel path generation, a trajectory arbiter, or other similar subsystem to further improve the planned course of action for the vehicle. The simulator 270 may output a final plan that includes both turning left and slowing down. This final output may then be consumed by the control module 225 to allow the test vehicle 100 to carry out the plan. Thus, as should be appreciated, the simulated planning data 275 may be obtained based on, for example, a scenario editor, a derivation from previously perceived planning data obtained from the vehicle 100 or a fleet of similar vehicles, or the simulated planning data 275 may be received at the vehicle 100 via a communications network or other distributed network.

Providing techniques to inject simulated planning data 275 into the vehicle's control system 204 has several benefits. Like with the various injection points described with reference to FIGS. 2A-2F, injecting the prediction data 265 at a particular stage in the control system 204 allows isolated tests to be performed for subsequent modules. For example, it may be desirable to test whether the vehicle's control module 225 is able to cause the vehicle to carry out complex plans that test the limits of the vehicle's physical abilities (e.g., breaking hard or maintaining a particular speed when turning). It may be difficult to have the planner 220 generate the desired plan for purposes of the test, since the planning module 220 may choose plans that are less aggressive. To cause the planner module 220 to output the desired plan, the physical test setup may be suited in a way that forces the planner module 220 to output the more aggressive plan (e.g., by having pedestrians suddenly jump in front of the test vehicle to have it break hard). Such a physical test setup may be difficult to implement. However, by providing the simulator 270 as presently disclosed, the test engineers may simply fabricate (e.g., utilizing the control system 200, 201, 202, 203, 204, 205, or some combination thereof) the desired simulated planning data 275 and inject it into the control system 203 to test the control module's 225 functionality.

Figure 2F:
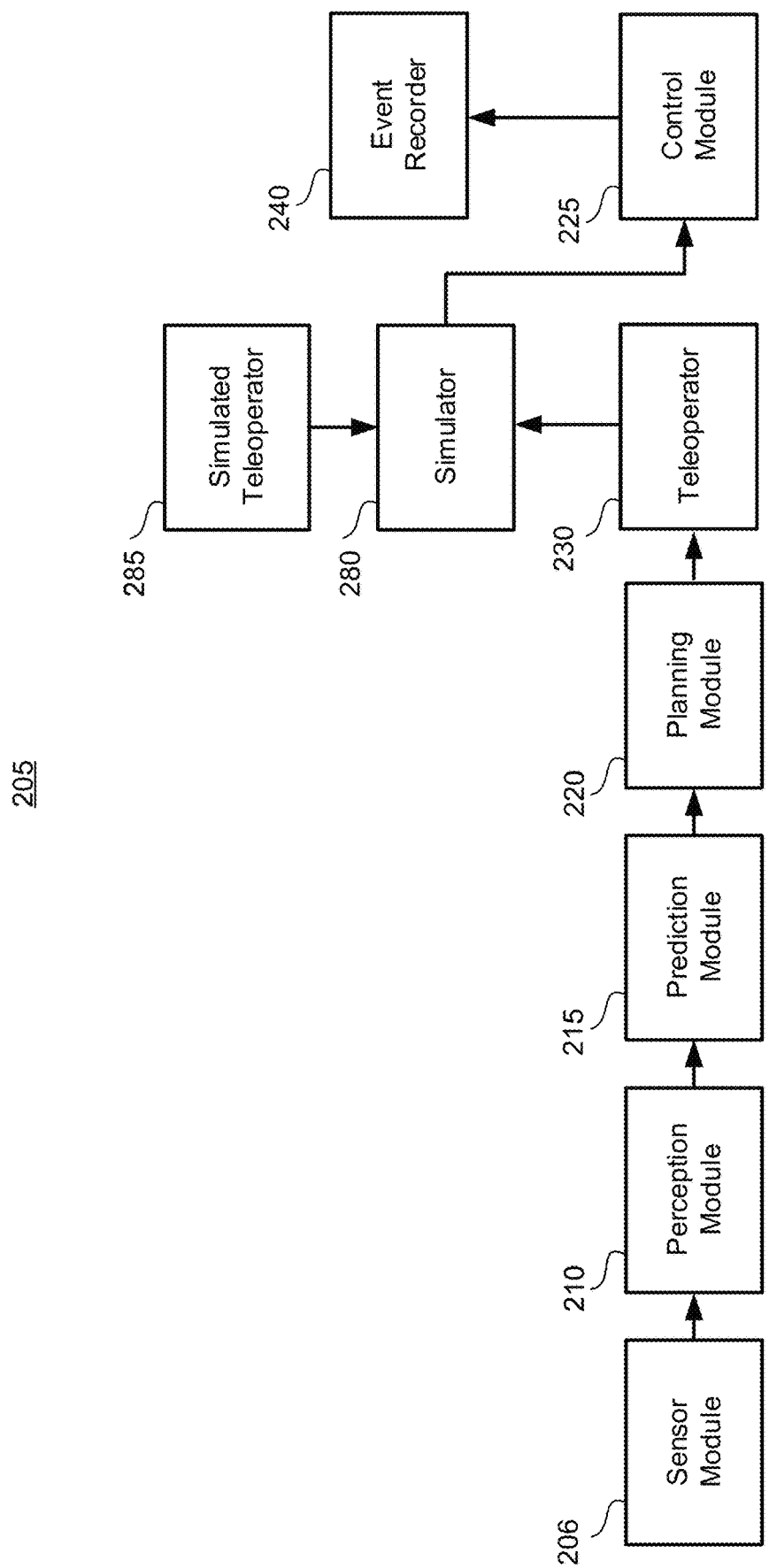
FIG. 2F illustrates an example block diagram for a modified control system with a simulator module for injecting teleoperator data.

FIG. 2F illustrates an example block diagram showing another modified control system 205 that an autonomous or semi-autonomous vehicle may execute during testing. In certain embodiments, the output of a teleoperator 230, rather than being directly input into the control module 225, serves as an input to a simulator 280. The teleoperator 230 may include any input provided to the vehicle 100 by, for example, one or more remote devices to control remotely the operation or other functionality of the vehicle. In some embodiments, a simulated teleoperator 285, which may be utilized to provide one or more simulated remote-control commands, is injected into the control module 225. Thus, as further depicted by FIG. 2F, the control module 225 may obtain its input from the simulator 280. For example, the simulator 280 may be tasked with generating a simulated teleoperator output or other remote-control command for consumption by the control module 225. In some embodiments, the simulator 280 may generate its output based on both the teleoperator 230 output and the simulated teleoperator 285 output. In other embodiments, the simulated teleoperator 285 may be generated, for example, by a scenario editor or based on a previously recorded output or remote-control command of the teleoperator 230. In certain embodiments, the simulated teleoperator 285 control commands may be obtained based on, for example, a scenario editor, a derivation from previously received teleoperator control commands obtained from the vehicle 100 or a fleet of similar vehicles, or the simulated teleoperator 285 control commands may be received at the vehicle 100 via one or more communications networks.

As it may be worth noting, while the present techniques described with respect to FIGS. 2A-2F are illustrated as including, for example, embodiments in which the simulated data (e.g., simulated sensor data 235, simulated sensor data 255, simulated prediction data 265, simulated planning data 275, simulated teleoperator 285) are generated and outputted serially (e.g., one at a time), it should be appreciated that, in other embodiments, the simulated sensor data 235, simulated sensor data 255, simulated prediction data 265, simulated planning data 275, and simulated teleoperator 285) may each be generated and outputted in parallel (e.g., concurrently). Indeed, in some embodiments, the control systems and/or modified control systems 200, 201, 202, 203, 204, and 205 may each operate or be implemented as individual subsystems operating in a serial or standalone configuration. In other embodiments, the control systems and/or modified control systems 200, 201, 202, 203, 204, and 205 may operate or be implemented as a singular control system operating in conjunction or in a parallel configuration. It should be further appreciated that the present techniques may be applied to any of various autonomous or semi-autonomous vehicles or vessels (e.g., cars, trucks, vans, buses, semi-trailer trucks, trains, tractors, forklifts, construction vehicles and equipment, drones, aircrafts, watercrafts, spacecrafts, and so forth). In this way, the present techniques may improve the performance of live tests by utilizing the on-board compute unit to process and/or respond to simulated data (e.g., computer-mediated data) or at least some combination of both the simulated data and real-world data.

Figure 3:
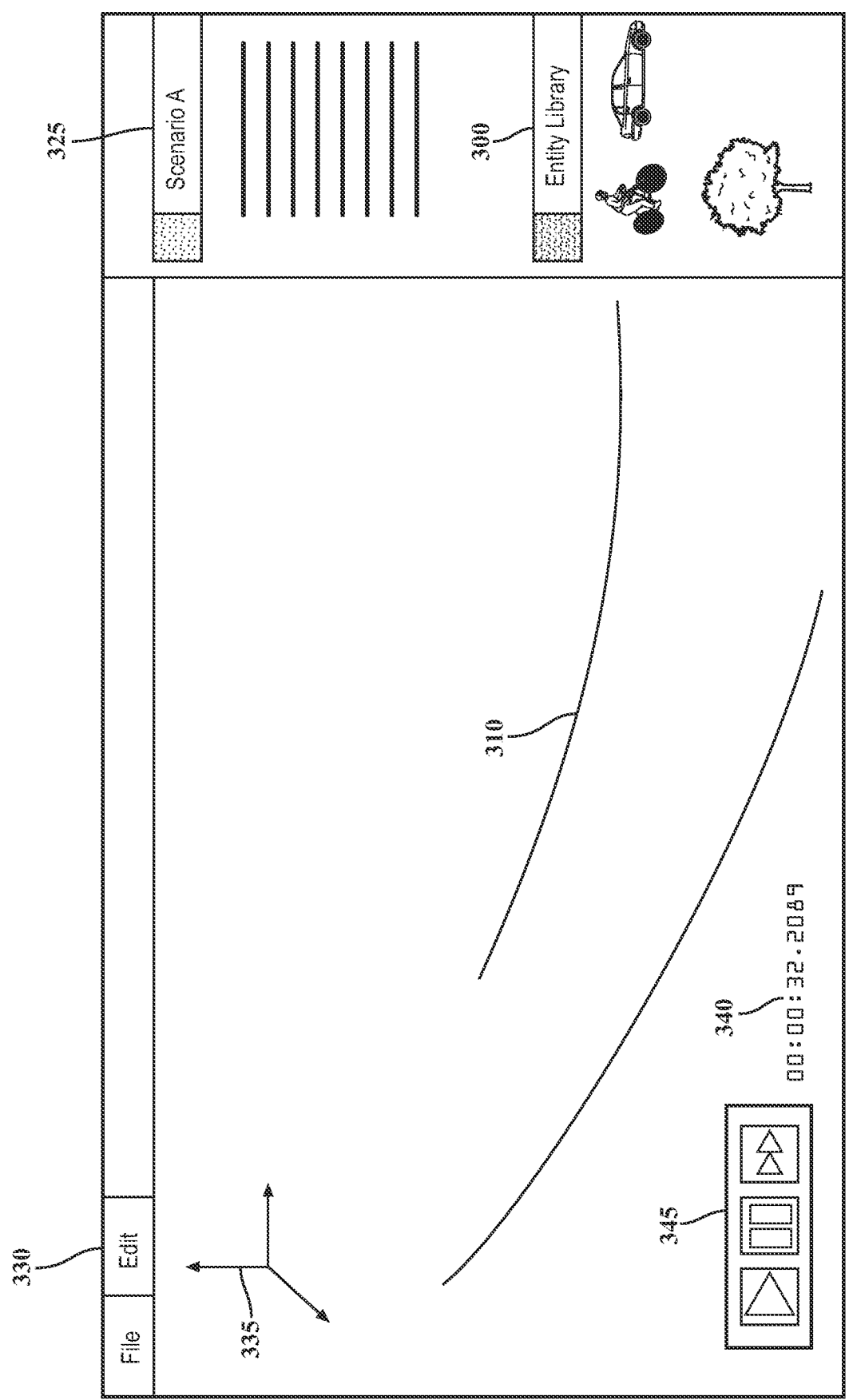
FIG. 3 illustrates an example user interface for a scenario editor for editing simulated data.

FIG. 3 illustrates an example user interface for a scenario editor for a vehicle test simulation. The scenario editor 330 is used to receive user input to create and modify a description of a simulated testing environment for the test vehicle 100. The description will subsequently be transformed and provided as an input to the simulator installed on the test vehicle 100 during testing. In this example, the virtual environment is constructed to represent and re-create the test course 310. In particular embodiments, a scenario may also include a time dimension, in which the various entities within a scenario may undergo state transitions, which are in turn associated to points in time.

In particular embodiments, the data including a scenario may be accessed by a user through a scenario menu 325. The data including a scenario may be stored, edited, or otherwise manipulated or modified through one or more menus associated to the user interface of the editor 330. The scenario may also have a 3-D representation, which is modifiable in a 3-D space that can be transformed and viewed by the user. User interface components corresponding to such 3-D functionality may include an axis triad 335. The ability to translate or rotate the 3-D scene (e.g. via mouse inputs) may also be available through the user interface. The scenario editor 330 may furthermore allow modification or manipulation of the time dimension of a scenario. User interface components such as a clock 340 and a transport bar 345 may allow the user to view the scenario at different points in time and edit the state of the scenario at those respective points in time. Given the computational representation of the scene and its spatiotemporal states, testing scenarios can be described with high precision and repeatability while also allowing for fine editing. In particular embodiments, scenarios may be derived from a library of scenarios, stored in, for example, a database or filesystem. Upon creation, modification, or application of a scenario, a scenario may be stored and added to such a library. In this manner, a plurality of testing scenarios may become available for quick application in a control system testing regime.

Figure 4:
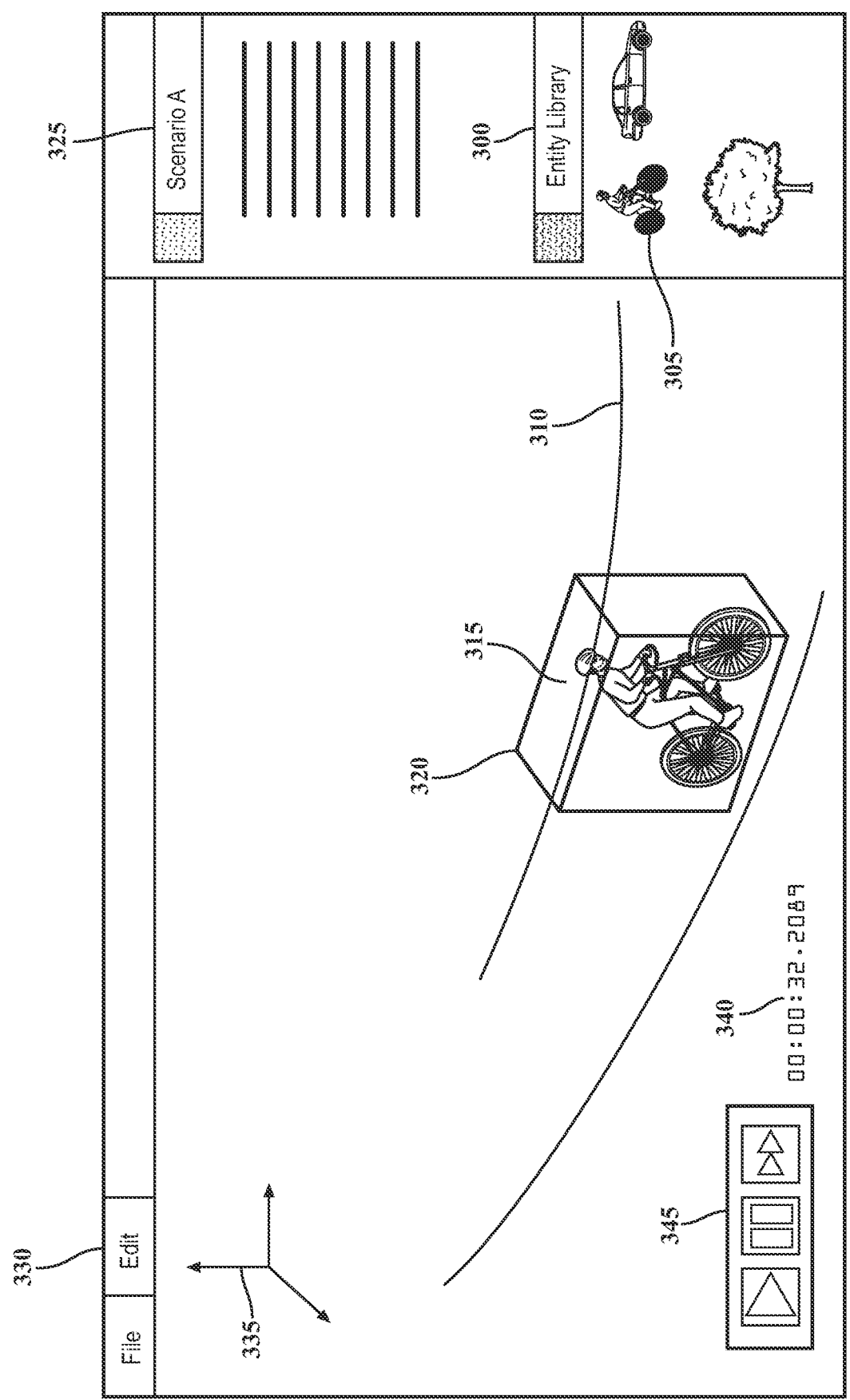
FIG. 4 illustrates a scenario editor being used to design simulated perception data.

FIG. 4 illustrates the scenario editor 330 being used to design simulated perception data. The user interface of the scenario editor 330 may include an entity library 300. Several graphical objects representing entities, such as the bicyclist 305, may be presented to the user in association with the entity library 300. The entities in the entity library 300 may have predefined as well as customizable behaviors, geometric attributes, or other attributes which are modifiable by the user through a series of submenus. The behaviors of the entities may be defined in terms of spatiotemporal states of a given entity with respect to the 3-D scene. For example, the bicyclist entity 305 may have a behavior defined as traveling at a constant velocity in the right lane of a test course in a given 3-D scene.

More complex behaviors may additionally be defined to simulate a range of testing scenarios. For example, the behavior of the bicyclist may be made dependent on the trajectory of the test vehicle 100, giving the bicyclist an appearance of agency or intelligence. Numerous dynamic actions may be defined for the bicyclist to define complex behavior. For example, the bicyclist entity 305 may be programmed to turn in a certain direction at a defined location, time, speed, etc. The bicyclist entity 305 may also move in accordance with a user-defined logic. The user-defined logic may dictate how the bicyclist entity 305 reacts to virtual objects defined within the editor 330 or physical objects that will be detected by the perception module at test time. For example, during test time, if the data from the perception module indicates that the test vehicle 100 is within a threshold distance of the bicyclist entity 305, the user-defined logic may cause the bicyclist entity to swerve.

In particular embodiments, a user's input may cause an entity in the entity library 300 to be added to a scenario. This may be accomplished, for example, by a "drag and drop" input from the user, for example, where the user drags an entity from the entity library 300 into the editor 330. For example, the user may wish to add a bicyclist entity 305 to the scenario at a given time and have the bicyclist entity 305 ride along the test course 310 for a given time interval. In response to the user input, the editor 330 may display a virtual bicyclist 315 at the user-specified location. In certain embodiments, a bounding box 320 may be shown to define the volume of space that the virtual bicyclist 315 would occupy. In particular embodiments, the bounding box 320 may be what the editor 330 outputs as the simulated perception data, with a range of associated attributes (e.g., the object type, speed, trajectory, position, orientation, color, depth, etc.). The time associated with the position of the virtual bicyclist 315 may be shown by the time stamp 340.

In particular embodiments, the user may fast-forward to a future second time stamp and specify where the virtual bicyclist 315 should be. The scenario editor 330 may then use the first and second timestamps to interpolate where the virtual bicyclist 315 should be at each time instant between the time stamps (e.g., determined based on a particular frame rate corresponding to the frame rate at which sensor data is captured by the sensors of the test vehicle 100). Alternatively, a speed and trajectory may be specified for the virtual bicyclist 315, and such data would be used to determine where the bicyclist 315 would be. After the user has finished creating, modifying, and storing the simulation scenario, the simulation scenario is then ready for use by the simulator module for direct injection into the prediction module of the test vehicle 100 during live testing. In this example, a virtual bicyclist 315 can be used as a substitute for having a real bicyclist partake in the autonomous-driving test, which can significantly improve the safety, as well as costs, test accuracy, reliability, and consistency.

In particular embodiments, previously-captured perception data output by a test vehicle's 100 perception module may be edited using the scenario editor 330. For example, it may often be the case that live perception data will have a certain amount of noise or inaccuracy that deviates from the prescribed test plan. The noise or inaccuracy may be due to physical sources in the test environment, quantization, digital faults and errors, and human imperfection. The scenario editor 330 may offer one or more transformation functionalities to the user, where the virtual entities or simulated test environment can be transformed through the application of simulated noise. The parameters of the noise may be adjustable by the user. For example, the user may be offered the option of adding white Gaussian noise to the bounding box 320 of the bicyclist 315 to add uncertainty to the exact extents of the bounding box 320. Such an uncertainty may be useful in testing the robustness of the test vehicle 100 prediction module.

Figure 5:
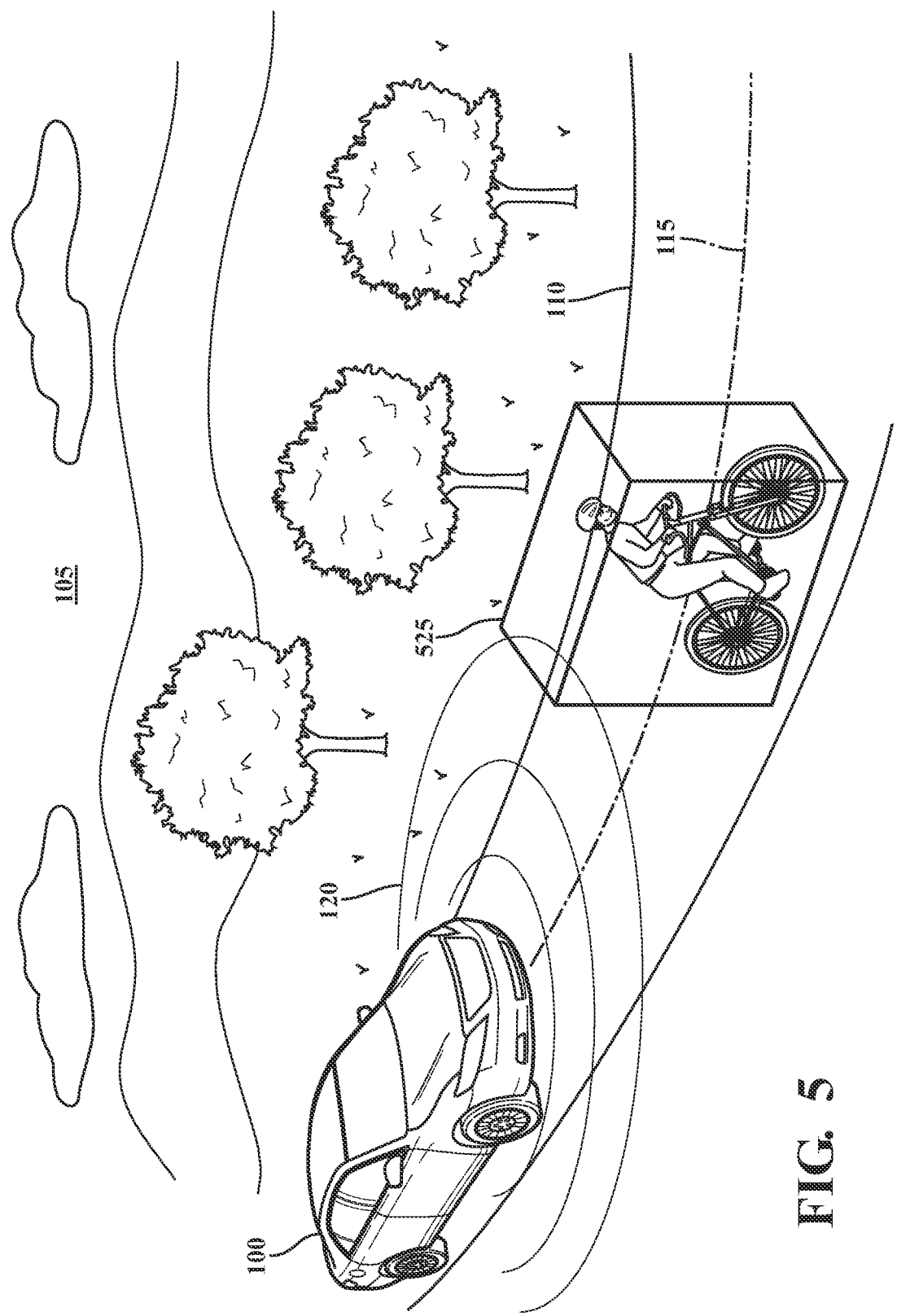
FIG. 5 illustrates updated perception data with an injected virtual object that would be processed by a test vehicle's prediction module.

FIG. 5 illustrates the simulated perception data that the prediction module of a test vehicle 100 would receive as input. As previously described, the test vehicle 100 may operate in a test mode controlled by the control systems 200, 201, 202, 203, 204, 205, or some combination thereof, as previously discussed above with respect to FIGS. 2A-2F, for example. While driving in the test mode, the simulator 230 may combine the perception data generated by the vehicle's perception module 210 with simulated perception data 235. Continuing with the example shown in FIGS. 4 and 5, test vehicle 100 may be driving in an environment and using its sphere of perception 320 to understand its surroundings. The test vehicle 100 may detect a variety of actually-observed physical objects. For example, the perception module 210 of the test vehicle 100 may identify an actual test course 110 and a surrounding environment 305 that includes trees, hills, etc.

As the test vehicle 100 drives along a trajectory 115 during the live test, the actually-observed perception data from the perception module 210 may be updated and combined with simulated perception data. The perception data is passed through the simulator 230, which combines the actually-observed perception data with simulated perception data as defined by a simulation scenario. In this manner, actually-observed perception data is combined with simulated perception data to implement the virtual testing scenario specified by the user through the scenario editor. For example, as the vehicle 100 progresses along the test trajectory 115, the simulator 230 correlates the observed perception data (e.g., real-world perception data) from the perception module with the desired simulated perception data (e.g., computer-mediated perception data or some combination of computer-mediated perception data and real-world perception data).

For example, the simulator may determine that the test vehicle 100 is at a trigger distance away from a virtual bicyclist 525 (e.g., corresponding to the virtual bicyclist 305 defined using the scenario editor 330). As such, the simulator 230 may inject the virtual bicyclist 525 into the observed perception data. The end result is that, from the perspective of the test vehicle's prediction module 215, the contextual environment around the test vehicle 100 corresponds to the illustration in FIG. 5, although the virtual bicyclist 525 does not exist in the real-world. That is, in accordance with the present techniques, the contextual environment around the test vehicle 100 includes a combination of real-world perception data and computer-mediated perception data for the purposes of testing and validation.

Furthermore, although the example illustration in FIG. 5 includes only the simulated virtual bicyclist 525, it should be appreciated that any number of objects or potential moving and/or stationary obstructions in the travel path of the vehicle 100 may be simulated. For example, the test course 110 and any component of the observed scene 105 may be included as simulated perception data, such that the combination of observed perception data (e.g., real-world perception data) and simulated perception data (e.g., computer-mediated perception data) can include any number of possible combinations. In other words, the test vehicle's prediction module 215 may not distinguish between the observed perception data (e.g., real-world perception data) and the simulated perception data (e.g., computer-mediated perception data). As such, the test vehicle 100 may be tested based upon a combination of observed perception data and simulated perception data in some embodiments, and tested based solely upon simulated perception data (e.g., computer-mediated perception data) in other embodiments, in accordance with the present techniques.

Figure 6:
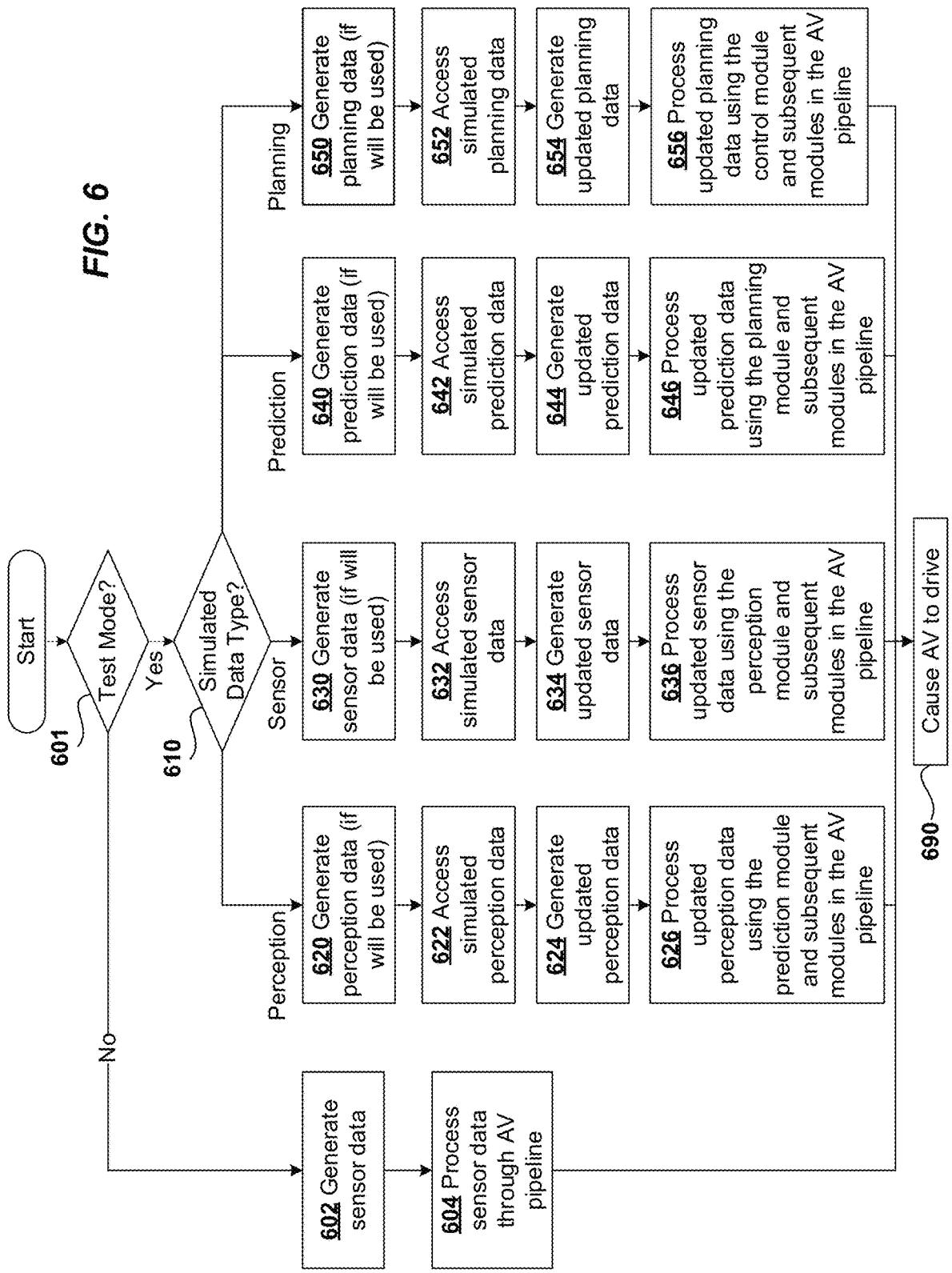
FIG. 6 illustrates an example method for controlling an autonomous or semi-autonomous vehicle.

FIG. 6 illustrates an example method for controlling an autonomous or semi-autonomous vehicle. The method may begin at step 601, where the computing system of an autonomous or semi-autonomous vehicle checks whether it is executing in a test mode. If it is not in the test mode, the computing system may operate using its control system, such as the one shown in FIG. 2A. For simplicity, FIG. 6 shows that at step 602, the system may generate sensor data using its sensors. For example, the vehicle's cameras, lidars, radars, and other sensors may capture information about the vehicle itself and the environment surrounding the vehicle. At step 604, the system may feed the sensor data into the control system. For example, as previously discussed, the sensor data may be processed by the vehicle's perception module, whose output is processed by the prediction module, whose output is processed by the planning module, and whose output is processed by the control module. At the end of the control system, the computing system may provide one or more outputs that causes the autonomous or semi-autonomous vehicle to execute the plan and travel a selected path at step 690.

On the other hand, if the vehicle is operating in the test mode, the computing system may operate differently depending on what type of simulated data is injected into the navigation control system. For example, at step 610, the system may determine the type of simulation desired. If simulated perception data (e.g., computer-mediated perception data) is to be injected, then the system may proceed with the process starting at step 620. The system may generate perception data based on sensor data captured by one or more sensors of the autonomous or semi-autonomous vehicle, with the perception data including one or more representations of physical objects in an environment of the autonomous or semi-autonomous vehicle. This step 620 is performed in cases where the simulated perception data (e.g., computer-mediated perception data) is to be combined with actually-observed perception data (e.g., real-world perception data). If the simulated perception data (e.g., computer-mediated perception data) is to be the sole input into the subsequent module, then the system may not perform step 620. At step 622, the system may access simulated perception data (e.g., computer-mediated perception data)

that include one or more representations of virtual objects. For example, the simulated perception data (e.g., computer-mediated perception data) may include a virtual bicyclist that the test engineers wish to inject into the vehicle's perception data. The simulated perception data (e.g., computer-mediated perception data) may be generated by a simulation editor or pre-generated by the perception module at a different time. For example, the simulated perception data (e.g., computer-mediated perception data) may include virtual objects that do not exist in the current environment, but corresponded to observed physical objects in a different environment at a different time (e.g., the simulated perception data is generated based on sensor data captured at a different time by another vehicle or the same test vehicle).

At step 624, the system may generate updated perception data based on the simulated perception data and, if desired, the perception data. In cases where simulated perception data (e.g., computer-mediated perception data) is combined with the actually-observed perception data (e.g., real-world perception data), then the updated perception data may include the one or more representations of physical objects and the one or more representations of virtual objects. The simulated perception data may include instructions for modifying the perception data generated by the perception module in order to generate the updated perception data. In some cases, the simulated perception data may include logic (e.g., via software, hardware, or some combination of software and hardware) associated with the representations of virtual objects. The logic may specify how the representation of the virtual objects is to be configured in the updated perception data (e.g., the logic may specify at what time and location to introduce the virtual object into the environment represented by the updated perception data).

The logic may also depend on a state of the test vehicle or a state of any of the representations of physical objects in the perceived data that were generated by the perception module. For example, the logic may cause a virtual bicyclist to be added into the updated perception data when the test vehicle is within close proximity to a particular location or when the test vehicle perceives a bike lane in the physical world, for example. At step 626, the system may process the updated perception data using the prediction module, and have its output be processed by the rest of the control system. At step 690, the end result of the control system causes the autonomous or semi-autonomous vehicle to drive based on the updated perception data.

Returning to step 610, if simulated sensor data is to be injected, then the system may proceed with the process starting at step 630. The system may generate sensor data using one or more sensors of the autonomous or semi-autonomous vehicle. This step 630 may be performed in cases where the simulated sensor data (e.g., computer-mediated sensor data) is to be combined with actually-observed sensor data (e.g., real-world sensor data). For example, the simulated sensor data (e.g., computer-mediated sensor data) may be radar data, and the observed sensor data (e.g., real-world sensor data) may be from different sensor types, such as cameras and lidars. If the simulated sensor data is to be the sole input into the subsequent module, then the system may not perform step 630. At step 632, the system may access simulated sensor data. For example, the simulated sensor data (e.g., computer-mediated sensor data) may include, for instance, simulated radar data of a virtual bicyclist that the test engineers wish to inject into the vehicle's sensor data. At step 634, the system may generate updated sensor data based on the simulated sensor data (e.g., computer-mediated sensor data) and, if desired, the actually-observed sensor data (e.g., real-world sensor data). At step 636, the system may process the updated sensor data using the perception module, and have its output be processed by the rest of the control system. At step 690, the end result of the control system causes the autonomous or semi-autonomous vehicle to drive based on the updated sensor data.

Returning to step 610, if simulated prediction data is to be injected, then the system may proceed with the process starting at step 640. The system may generate prediction data using its control system. For example, the prediction data may be generated based on actually-observed data (e.g., real-world data), using the sensor, perception, and prediction modules. This step 640 may be performed in cases where the simulated prediction data (e.g., computer-mediated prediction data) is to be combined with prediction data that is generated based on actually-observed data (e.g., real-world data). If the simulated prediction data is to be the sole input into the subsequent module, then the system may not perform step 640. At step 642, the system may access simulated prediction data. For example, the simulated prediction data (e.g., computer-mediated prediction data) may include predicted positions of objects or agents in the environment. At step 644, the system may generate updated prediction data based on the simulated prediction data and, if desired, prediction data generated in step 640. At step 646, the system may process the updated prediction data using the planning module, and have its output be processed by the rest of the control system. At step 690, the end result of the control system causes the autonomous or semi-autonomous vehicle to drive based on the updated prediction data.

Returning to step 610, if simulated planning data is to be injected, then the system may proceed with the process starting at step 650. The system may generate planning data using its control system. For example, the planning data may be generated based on actually-observed data (e.g., real-world data), using the sensor, perception, prediction, and planning modules. This step 650 may be performed in cases where the simulated planning data (e.g., computer-mediated planning data) is to be combined with planning data that is generated based on actually-observed data (e.g., real-world data). If the simulated planning data is to be the sole input into the subsequent module, then the system may not perform step 650. At step 652, the system may access simulated planning data. For example, the simulated planning data (e.g., computer-mediated planning data) may include a plan for the test vehicle. At step 654, the system may generate updated planning data based on the simulated planning data and, if desired, planning data generated in step 650 (e.g., the planning data generated in step 650 may tell the vehicle to veer left, but the simulated planning data further requests that the vehicle to slow down). At step 656, the system may process the updated planning data using the control module. At step 690, the end result of the control system causes the autonomous or semi-autonomous vehicle to drive based on the updated planning data.

Figure 7:
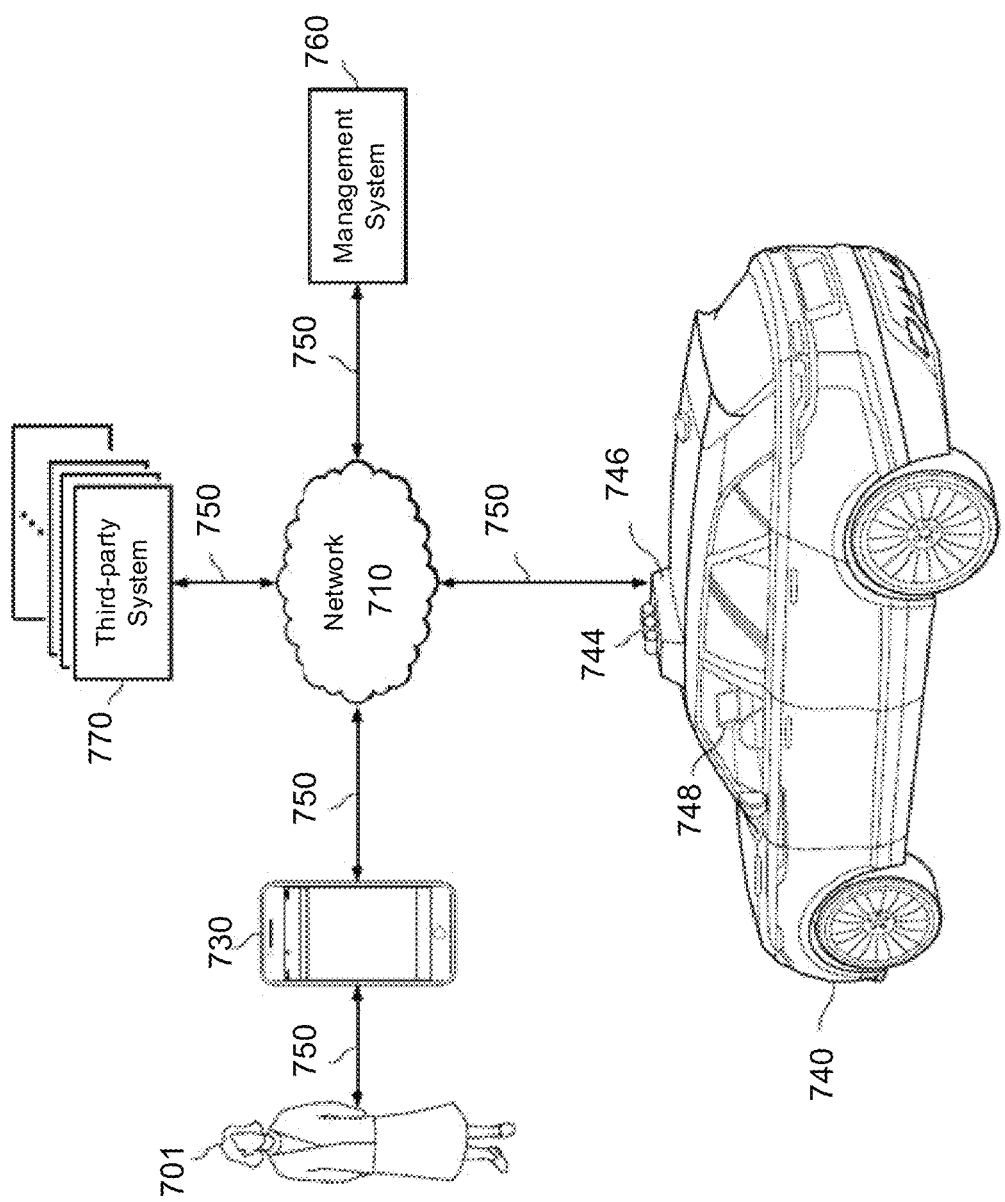
FIG. 7 illustrates an example block diagram of a transportation management environment for testing and validating autonomous or semi-autonomous vehicle driving systems.

FIG. 7 illustrates an example block diagram of a transportation management environment for testing and validating autonomous or semi-autonomous vehicle driving systems. In particular embodiments, the environment may include various computing entities, such as a user computing device 730 of a user 701 (e.g., a ride provider or requestor), a transportation management system 760, an autonomous or semi-autonomous vehicle 740, and one or more third-party system 770. The computing entities may be communicatively connected over any suitable network 710. As an example, and not by way of limitation, one or more portions of network 710 may include an ad hoc network, an extranet, a virtual private network (VPN), a local area network (LAN), a wireless LAN (WLAN), a wide area network (WAN), a wireless WAN (WWAN), a metropolitan area network (MAN), a portion of the Internet, a portion of Public Switched Telephone Network (PSTN), a cellular network, or a combination of any of the above. In particular embodiments, any suitable network arrangement and protocol enabling the computing entities to communicate with each other may be used. Although FIG. 7 illustrates a single user device 730, a single transportation management system 760, a single vehicle 740, a plurality of third-party systems 770, and a single network 710, this disclosure contemplates any suitable number of each of these entities. As an example, and not by way of limitation, the network environment may include multiple users 701, user devices 730, transportation management systems 760, autonomous or semi-autonomous vehicles 740, third-party systems 770, and networks 710.

The user device 730, transportation management system 760, autonomous or semi-autonomous vehicle 740, and third-party system 770 may be communicatively connected or co-located with each other in whole or in part. These computing entities may communicate via different transmission technologies and network types. For example, the user device 730 and the vehicle 740 may communicate with each other via a cable or short-range wireless communication (e.g., Bluetooth, NFC, WI-FI, etc.), and together they may be connected to the Internet via a cellular network that is accessible to either one of the devices (e.g., the user device 730 may be a smartphone with LTE connection). The transportation management system 760 and third-party system 770, on the other hand, may be connected to the Internet via their respective LAN/WLAN networks and Internet Service Providers (ISP).

FIG. 7 illustrates transmission links 750 that connect user device 730, autonomous or semi-autonomous vehicle 740, transportation management system 760, and third-party system 770 to communication network 710. This disclosure contemplates any suitable transmission links 750, including, e.g., wire connections (e.g., USB, Lightning, Digital Subscriber Line (DSL) or Data Over Cable Service Interface Specification (DOCSIS)), wireless connections (e.g., WI-FI, WiMAX, cellular, satellite, NFC, Bluetooth), optical connections (e.g., Synchronous Optical Networking (SONET), Synchronous Digital Hierarchy (SDH)), any other wireless communication technologies, and any combination thereof. In particular embodiments, one or more links 750 may connect to one or more networks 710, which may include in part, e.g., ad-hoc network, the Intranet, extranet, VPN, LAN, WLAN, WAN, WWAN, MAN, PSTN, a cellular network, a satellite network, or any combination thereof. The computing entities may not necessarily use the same type of transmission link 750. For example, the user device 730 may communicate with the transportation management system via a cellular network and the Internet but communicate with the autonomous vehicle 740 via Bluetooth or a physical wire connection.

In particular embodiments, the transportation management system 760 may fulfill ride requests for one or more users 701 by dispatching suitable vehicles. The transportation management system 760 may receive any number of ride requests from any number of ride requestors 701. In particular embodiments, a ride request from a ride requestor 701 may include an identifier that identifies the ride requestor in the system 760. The transportation management system 760 may use the identifier to access and store the ride requestor's 701 information, in accordance with the requestor's 701 privacy settings. The ride requestor's 701 information may be stored in one or more data stores (e.g., a relational database system) associated with and accessible to the transportation management system 760. In particular embodiments, ride requestor information may include profile information about a particular ride requestor 701.

In particular embodiments, the ride requestor 701 may be associated with one or more categories or types, through which the ride requestor 701 may be associated with aggregate information about certain ride requestors of those categories or types. Ride information may include, for example, preferred pick-up and drop-off locations, driving preferences (e.g., safety comfort level, preferred speed, rates of acceleration/deceleration, safety distance from other vehicles when traveling at various speeds, route, etc.), entertainment preferences and settings (e.g., preferred music genre or playlist, audio volume, display brightness, etc.), temperature settings, whether conversation with the driver is welcomed, frequent destinations, historical riding patterns (e.g., time of day of travel, starting and ending locations, etc.), preferred language, age, gender, or any other suitable information. In particular embodiments, the transportation management system 760 may classify a user 701 based on known information about the user 701 (e.g., using machine-learning classifiers), and use the classification to retrieve relevant aggregate information associated with that class. For example, the system 760 may classify a user 701 as a young adult and retrieve relevant aggregate information associated with young adults, such as the type of music generally preferred by young adults.

Transportation management system 760 may also store and access ride information. Ride information may include locations related to the ride, traffic data, route options, optimal pick-up or drop-off locations for the ride, or any other suitable information associated with a ride. As an example, and not by way of limitation, when the transportation management system 760 receives a request to travel from San Francisco International Airport (SFO) to Palo Alto, Calif., the system 760 may access or generate any relevant ride information for this particular ride request. The ride information may include, for example, preferred pick-up locations at SFO; alternate pick-up locations in the event that a pick-up location is incompatible with the ride requestor (e.g., the ride requestor may be disabled and cannot access the pick-up location) or the pick-up location is otherwise unavailable due to construction, traffic congestion, changes in pick-up/drop-off rules, or any other reason; one or more routes to navigate from SFO to Palo Alto; preferred off-ramps for a type of user; or any other suitable information associated with the ride.

In particular embodiments, portions of the ride information may be based on historical data associated with historical rides facilitated by the system 760. For example, historical data may include aggregate information generated based on past ride information, which may include any ride information described herein and telemetry data collected by sensors in autonomous vehicles and/or user devices. Historical data may be associated with a particular user (e.g., that particular user's preferences, common routes, etc.), a category/class of users (e.g., based on demographics), and/or all users of the system 760. For example, historical data specific to a single user may include information about past rides that particular user has taken, including the locations at which the user is picked up and dropped off, music the user likes to listen to, traffic information associated with the rides, time of the day the user most often rides, and any other suitable information specific to the user. As another example, historical data associated with a category/class of users may include, e.g., common or popular ride preferences of users in that category/class, such as teenagers preferring pop music, ride requestors who frequently commute to the financial district may prefer to listen to the news, etc.

As yet another example, historical data associated with all users may include general usage trends, such as traffic and ride patterns. Using historical data, the system 760 in particular embodiments may predict and provide ride suggestions in response to a ride request. In particular embodiments, the system 760 may use machine-learning, such as neural networks, regression algorithms, instance-based algorithms (e.g., k-Nearest Neighbor), decision-tree algorithms, Bayesian algorithms, clustering algorithms, association-rule-learning algorithms, deep-learning algorithms, dimensionality-reduction algorithms, ensemble algorithms, and any other suitable machine-learning algorithms known to persons of ordinary skill in the art. The machine-learning models may be trained using any suitable training algorithm, including supervised learning based on labeled training data, unsupervised learning based on unlabeled training data, and/or semi-supervised learning based on a mixture of labeled and unlabeled training data.

In particular embodiments, transportation management system 760 may include one or more server computers. Each server may be a unitary server or a distributed server spanning multiple computers or multiple datacenters. The servers may be of various types, such as, for example and without limitation, web server, news server, mail server, message server, advertising server, file server, application server, exchange server, database server, proxy server, another server suitable for performing functions or processes described herein, or any combination thereof. In particular embodiments, each server may include hardware, software, or embedded logic components or a combination of two or more such components for carrying out the appropriate functionalities implemented or supported by the server. In particular embodiments, transportation management system 760 may include one or more data stores. The data stores may be used to store various types of information, such as ride information, ride requestor information, ride provider information, historical information, third-party information, or any other suitable type of information. In particular embodiments, the information stored in the data stores may be organized according to specific data structures. In particular embodiments, each data store may be a relational, columnar, correlation, or any other suitable type of database system. Although this disclosure describes or illustrates particular types of databases, this disclosure contemplates any suitable types of databases. Particular embodiments may provide interfaces that enable a user device 730 (which may belong to a ride requestor or provider), a transportation management system 760, vehicle system 740, or a third-party system 770 to process, transform, manage, retrieve, modify, add, or delete the information stored in the data store.

In particular embodiments, transportation management system 760 may include an authorization server (or any other suitable component(s)) that allows users 701 to opt-in to or opt-out of having their information and actions logged, recorded, or sensed by transportation management system 760 or shared with other systems (e.g., third-party systems 770). In particular embodiments, a user 701 may opt-in or opt-out by setting appropriate privacy settings. A privacy setting of a user may determine what information associated with the user may be logged, how information associated with the user may be logged, when information associated with the user may be logged, who may log information associated with the user, whom information associated with the user may be shared with, and for what purposes information associated with the user may be logged or shared. Authorization servers may be used to enforce one or more privacy settings of the users 701 of transportation management system 760 through blocking, data hashing, anonymization, or other suitable techniques as appropriate.

In particular embodiments, third-party system 770 may be a network-addressable computing system that may provide HD maps or host GPS maps, customer reviews, music or content, weather information, or any other suitable type of information. Third-party system 770 may generate, store, receive, and send relevant data, such as, for example, map data, customer review data from a customer review website, weather data, or any other suitable type of data. Third-party system 770 may be accessed by the other computing entities of the network environment either directly or via network 710. For example, user device 730 may access the third-party system 770 via network 710, or via transportation management system 760. In the latter case, if credentials are to be accessed the third-party system 770, the user 701 may provide such information to the transportation management system 760, which may serve as a proxy for accessing content from the third-party system 770.

In particular embodiments, user device 730 may be a mobile computing device such as a smartphone, tablet computer, or laptop computer. User device 730 may include one or more processors (e.g., CPU and/or GPU), memory, and storage. An operating system and applications may be installed on the user device 730, such as, e.g., a transportation application associated with the transportation management system 760, applications associated with third-party systems 770, and applications associated with the operating system. User device 730 may include functionality for determining its location, direction, or orientation, based on integrated sensors such as GPS, compass, gyroscope, or accelerometer. User device 730 may also include wireless transceivers for wireless communication and may support wireless communication protocols such as Bluetooth, near-field communication (NFC), infrared (IR) communication, WI-FI, and/or 2G/3G/4G/LTE/5G mobile communication standard. User device 730 may also include one or more cameras, scanners, touchscreens, microphones, speakers, and any other suitable input-output devices.

In particular embodiments, the vehicle 740 may be an autonomous or semi-autonomous vehicle and equipped with an array of sensors 744, a navigation system 746, and a ride-service computing device 748. In particular embodiments, a fleet of autonomous or semi-autonomous vehicles 740 may be managed by the transportation management system 760. The fleet of autonomous vehicles 740, in whole or in part, may be owned by the entity associated with the transportation management system 760, or they may be owned by a third-party entity relative to the transportation management system 760. In either case, the transportation management system 760 may control the operations of the autonomous vehicles 740, including, e.g., dispatching select vehicles 740 to fulfill ride requests, instructing the vehicles 740 to perform select operations (e.g., head to a service center or charging/fueling station, pull over, stop immediately, self-diagnose, lock/unlock compartments, change music station, change temperature, and any other suitable operations), and instructing the vehicles 740 to enter select operation modes (e.g., operate normally, drive at a reduced speed, drive under the command of human operators, and any other suitable operational modes).

In particular embodiments, the autonomous or semi-autonomous vehicles 740 may receive data from and transmit data to the transportation management system 760 and the third-party system 770. Example of received data may include, e.g., instructions, new software or software updates, maps, 3-D models, trained or untrained machine-learning models, location information (e.g., location of the ride requestor, the autonomous or semi-autonomous vehicle 740 itself, other vehicles 740, and target destinations such as service centers), navigation information, traffic information, weather information, entertainment content (e.g., music, video, and news) ride requestor information, ride information, and any other suitable information. Examples of data transmitted from the autonomous or semi-autonomous vehicle 740 may include, e.g., telemetry and sensor data, determinations/decisions based on such data, vehicle condition or state (e.g., battery/fuel level, tire and brake conditions, sensor condition, speed, odometer, etc.), location, navigation data, passenger inputs (e.g., through a user interface in the vehicle 740, passengers may send/receive data to the transportation management system 760 and/or third-party system 770), and any other suitable data.

In particular embodiments, autonomous or semi-autonomous vehicles 740 may also communicate with each other as well as other traditional human-driven vehicles, including those managed and not managed by the transportation management system 760. For example, one vehicle 740 may communicate with another vehicle data regarding their respective location, condition, status, sensor reading, and any other suitable information. In particular embodiments, vehicle-to-vehicle communication may take place over direct short-range wireless connection (e.g., WI-FI, Bluetooth, NFC) and/or over a network (e.g., the Internet or via the transportation management system 760 or third-party system 770).

In particular embodiments, an autonomous or semi-autonomous vehicle 740 may obtain and process sensor/telemetry data. Such data may be captured by any suitable sensors. For example, the vehicle 740 may have a LiDAR sensor array of multiple LiDAR transceivers that are configured to rotate 360°, emitting pulsed laser light and measuring the reflected light from objects surrounding vehicle 740. In particular embodiments, LiDAR transmitting signals may be steered by use of a gated light valve, which may be a MEMs device that directs a light beam using the principle of light diffraction. Such a device may not use a gimbaled mirror to steer light beams in 360° around the autonomous or semi-autonomous vehicle. Rather, the gated light valve may direct the light beam into one of several optical fibers, which may be arranged such that the light beam may be directed to many discrete positions around the autonomous or semi-autonomous vehicle. Thus, data may be captured in 360° around the autonomous or semi-autonomous vehicle, but no rotating parts may be necessary. A LiDAR is an effective sensor for measuring distances to targets, and as such may be used to generate a 3-D model of the external environment of the autonomous or semi-autonomous vehicle 740. As an example, and not by way of limitation, the 3-D model may represent the external environment including objects such as other cars, curbs, debris, objects, and pedestrians up to a maximum range of the sensor arrangement (e.g., 50 meters, 100 meters, or 200 meters).

As another example, the autonomous or semi-autonomous vehicle 740 may have optical cameras pointing in different directions. The cameras may be used for, e.g., recognizing roads, lane markings, street signs, traffic lights, police, other vehicles, and any other visible objects of interest. To enable the vehicle 740 to "see" at night, infrared cameras may be installed. In particular embodiments, the vehicle may be equipped with stereo vision for, e.g., spotting hazards such as pedestrians or tree branches on the road. As another example, the vehicle 740 may have radars for, e.g., detecting other vehicles and/or hazards afar. Furthermore, the vehicle 740 may have ultrasound equipment for, e.g., parking and obstacle detection. In addition to sensors enabling the vehicle 740 to detect, measure, and understand the external world around it, the vehicle 740 may further be equipped with sensors for detecting and self-diagnosing the vehicle's own state and condition. For example, the vehicle 740 may have wheel sensors for, e.g., measuring velocity; global positioning system (GPS) for, e.g., determining the vehicle's current geolocation; and/or inertial measurement units, accelerometers, gyroscopes, and/or odometer systems for movement or motion detection.

While the description of these sensors provides particular examples of utility, one of ordinary skill in the art would appreciate that the utilities of the sensors are not limited to those examples. Further, while an example of a utility may be described with respect to a particular type of sensor, it should be appreciated that the utility may be achieved using any combination of sensors. For example, an autonomous vehicle 740 may build a 3-D model of its surrounding based on data from its LiDAR, radar, sonar, and cameras, along with a pre-generated map obtained from the transportation management system 760 or the third-party system 770. Although sensors 744 appear in a particular location on autonomous vehicle 740 in FIG. 8, sensors 744 may be located in any suitable location in or on the autonomous or semi-autonomous vehicle 740. Example locations for sensors include the front and rear bumpers, the doors, the front windshield, on the side panel, or any other suitable location.

In particular embodiments, the autonomous vehicle 740 may be equipped with a processing unit (e.g., one or more CPUs and GPUs), memory, and storage. The vehicle 740 may thus be equipped to perform a variety of computational and processing tasks, including processing the sensor data, extracting useful information, and operating accordingly. For example, based on images captured by its cameras and a machine-vision model, the vehicle 740 may identify particular types of objects captured by the images, such as pedestrians, other vehicles, lanes, curbs, and any other objects of interest.

In particular embodiments, the autonomous vehicle 740 may have a navigation system 746 responsible for safely navigating the autonomous vehicle 740. In particular embodiments, the navigation system 746 may take as input any type of sensor data from, e.g., a Global Positioning System (GPS) module, inertial measurement unit (IMU), LiDAR sensors, optical cameras, radio frequency (RF) transceivers, or any other suitable telemetry or sensory mechanisms. The navigation system 746 may also utilize, e.g., map data, traffic data, accident reports, weather reports, instructions, target destinations, and any other suitable information to determine navigation routes and particular driving operations (e.g., slowing down, speeding up, stopping, swerving, etc.). In particular embodiments, the navigation system 746 may use its determinations to control the vehicle 740 to operate in prescribed manners and to guide the autonomous vehicle 740 to its destinations without colliding into other objects. Although the physical embodiment of the navigation system 746 (e.g., the processing unit) appears in a particular location on autonomous vehicle 740 in FIG. 8, navigation system 746 may be located in any suitable location in or on autonomous vehicle 740. Example locations for navigation system 746 include inside the cabin or passenger compartment of autonomous vehicle 740, near the engine/battery, near the front seats, rear seats, or in any other suitable location.

In particular embodiments, the autonomous or semi-autonomous vehicle 740 may be equipped with a ride-service computing device 748, which may be a tablet or any other suitable device installed by transportation management system 760 to allow the user to interact with the autonomous vehicle 740, transportation management system 760, other users 801, or third-party systems 770. In particular embodiments, installation of ride-service computing device 748 may be accomplished by placing the ride-service computing device 748 inside autonomous vehicle 740, and further configuring it to communicate with the vehicle 740 via a wire or wireless connection (e.g., via Bluetooth). Although FIG. 7 illustrates a single ride-service computing device 748 at a particular location in autonomous vehicle 740, autonomous or semi-autonomous vehicle 740 may include several ride-service computing devices 748 in several different locations within the vehicle.

As an example, and not by way of limitation, the autonomous or semi-autonomous vehicle 740 may include four ride-service computing devices 748 located in the following places: one in front of the front-left passenger seat (e.g., driver's seat in traditional U.S. automobiles), one in front of the front-right passenger seat, one in front of each of the rear-left and rear-right passenger seats. In particular embodiments, ride-service computing device 748 may be detachable from any component of autonomous vehicle 740. This may allow users to handle ride-service computing device 748 in a manner consistent with other tablet computing devices. As an example, and not by way of limitation, a user may move ride-service computing device 748 to any location in the cabin or passenger compartment of the autonomous or semi-autonomous vehicle 740, may hold ride-service computing device 748, or handle ride-service computing device 748 in any other suitable manner. Although this disclosure describes providing a particular computing device in a particular manner, this disclosure contemplates providing any suitable computing device in any suitable manner.

Figure 8:
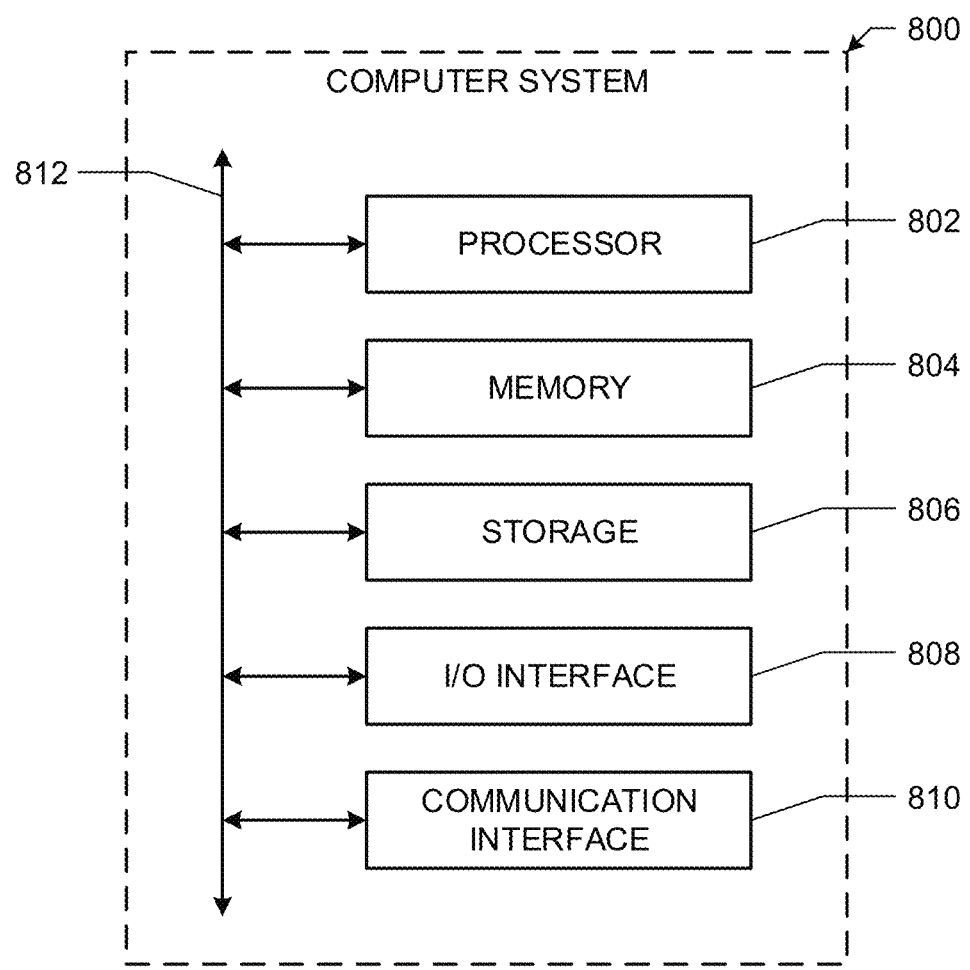
FIG. 8 illustrates an example of a computing system.

FIG. 8 illustrates an example computer system 800. In particular embodiments, one or more computer systems 800 perform one or more steps of one or more methods described or illustrated herein. In particular embodiments, one or more computer systems 800 provide the functionalities described or illustrated herein. In particular embodiments, software running on one or more computer systems 800 performs one or more steps of one or more methods described or illustrated herein or provides the functionalities described or illustrated herein. Particular embodiments include one or more portions of one or more computer systems 800. Herein, a reference to a computer system may encompass a computing device, and vice versa, where appropriate. Moreover, a reference to a computer system may encompass one or more computer systems, where appropriate.

This disclosure contemplates any suitable number of computer systems 800. This disclosure contemplates computer system 800 taking any suitable physical form. As example and not by way of limitation, computer system 800 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, an augmented/virtual reality device, or a combination of two or more of these. Where appropriate, computer system 800 may include one or more computer systems 800; be unitary or distributed; span multiple locations; span multiple machines; span multiple data centers; or reside in a cloud, which may include one or more cloud components in one or more networks. Where appropriate, one or more computer systems 800 may perform without substantial spatial or temporal limitation one or more steps of one or more methods described or illustrated herein. As an example, and not by way of limitation, one or more computer systems 800 may perform in real time or in batch mode one or more steps of one or more methods described or illustrated herein. One or more computer systems 800 may perform at different times or at different locations one or more steps of one or more methods described or illustrated herein, where appropriate.

In particular embodiments, computer system 800 includes a processor 802, memory 804, storage 806, an input/output (I/O) interface 808, a communication interface 810, and a bus 812. Although this disclosure describes and illustrates a particular computer system having a particular number of particular components in a particular arrangement, this disclosure contemplates any suitable computer system having any suitable number of any suitable components in any suitable arrangement.

In particular embodiments, processor 802 includes hardware for executing instructions, such as those making up a computer program. As an example, and not by way of limitation, to execute instructions, processor 802 may retrieve (or fetch) the instructions from an internal register, an internal cache, memory 804, or storage 806; decode and execute them; and then write one or more results to an internal register, an internal cache, memory 804, or storage 806. In particular embodiments, processor 802 may include one or more internal caches for data, instructions, or addresses. This disclosure contemplates processor 802 including any suitable number of any suitable internal caches, where appropriate. As an example, and not by way of limitation, processor 802 may include one or more instruction caches, one or more data caches, and one or more translation lookaside buffers (TLBs). Instructions in the instruction caches may be copies of instructions in memory 804 or storage 806, and the instruction caches may speed up retrieval of those instructions by processor 802. Data in the data caches may be copies of data in memory 804 or storage 806 that are to be operated on by computer instructions; the results of previous instructions executed by processor 802 that are accessible to subsequent instructions or for writing to memory 804 or storage 806; or any other suitable data. The data caches may speed up read or write operations by processor 802. The TLBs may speed up virtual-address translation for processor 802. In particular embodiments, processor 802 may include one or more internal registers for data, instructions, or addresses. This disclosure contemplates processor 802 including any suitable number of any suitable internal registers, where appropriate. Where appropriate, processor 802 may include one or more arithmetic logic units (ALUs), be a multi-core processor, or include one or more processors 802. Although this disclosure describes and illustrates a particular processor, this disclosure contemplates any suitable processor.

In particular embodiments, memory 804 includes main memory for storing instructions for processor 802 to execute or data for processor 802 to operate on. As an example, and not by way of limitation, computer system 800 may load instructions from storage 806 or another source (such as another computer system 800) to memory 804. Processor 802 may then load the instructions from memory 804 to an internal register or internal cache. To execute the instructions, processor 802 may retrieve the instructions from the internal register or internal cache and decode them. During or after execution of the instructions, processor 802 may write one or more results (which may be intermediate or final results) to the internal register or internal cache. Processor 802 may then write one or more of those results to memory 804. In particular embodiments, processor 802 executes only instructions in one or more internal registers or internal caches or in memory 804 (as opposed to storage 806 or elsewhere) and operates only on data in one or more internal registers or internal caches or in memory 804 (as opposed to storage 806 or elsewhere). One or more memory buses (which may each include an address bus and a data bus) may couple processor 802 to memory 804. Bus 812 may include one or more memory buses, as described in further detail below. In particular embodiments, one or more memory management units (MMUs) reside between processor 802 and memory 804 and facilitate accesses to memory 804 requested by processor 802. In particular embodiments, memory 804 includes random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM. This disclosure contemplates any suitable RAM. Memory 804 may include one or more memories 804, where appropriate. Although this disclosure describes and illustrates particular memory, this disclosure contemplates any suitable memory.

In particular embodiments, storage 806 includes mass storage for data or instructions. As an example, and not by way of limitation, storage 806 may include a hard disk drive (HDD), a floppy disk drive, flash memory, an optical disc, a magneto-optical disc, magnetic tape, or a Universal Serial Bus (USB) drive or a combination of two or more of these. Storage 806 may include removable or non-removable (or fixed) media, where appropriate. Storage 806 may be internal or external to computer system 800, where appropriate. In particular embodiments, storage 806 is non-volatile, solid-state memory. In particular embodiments, storage 806 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 806 taking any suitable physical form. Storage 806 may include one or more storage control units facilitating communication between processor 802 and storage 806, where appropriate. Where appropriate, storage 806 may include one or more storages 806. Although this disclosure describes and illustrates particular storage, this disclosure contemplates any suitable storage.

In particular embodiments, I/O interface 808 includes hardware, software, or both, providing one or more interfaces for communication between computer system 800 and one or more I/O devices. Computer system 800 may include one or more of these I/O devices, where appropriate. One or more of these I/O devices may enable communication between a person and computer system 800. As an example, and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 808 for them. Where appropriate, I/O interface 808 may include one or more device or software drivers enabling processor 802 to drive one or more of these I/O devices. I/O interface 808 may include one or more I/O interfaces 808, where appropriate. Although this disclosure describes and illustrates a particular I/O interface, this disclosure contemplates any suitable I/O interface.

In particular embodiments, communication interface 810 includes hardware, software, or both providing one or more interfaces for communication (such as, for example, packet-based communication) between computer system 800 and one or more other computer systems 800 or one or more networks. As an example, and not by way of limitation, communication interface 810 may include a network interface controller (NIC) or network adapter for communicating with an Ethernet or any other wire-based network or a wireless NIC (WNIC) or wireless adapter for communicating with a wireless network, such as a WI-FI network. This disclosure contemplates any suitable network and any suitable communication interface 810 for it. As an example, and not by way of limitation, computer system 800 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 800 may communicate with a wireless PAN (WPAN) (such as, for example, a Bluetooth WPAN), a WI-FI network, a WI-MAX network, a cellular telephone network (such as, for example, a Global System for Mobile Communications (GSM) network), or any other suitable wireless network or a combination of two or more of these. Computer system 800 may include any suitable communication interface 810 for any of these networks, where appropriate. Communication interface 810 may include one or more communication interfaces 810, where appropriate. Although this disclosure describes and illustrates a particular communication interface, this disclosure contemplates any suitable communication interface.

In particular embodiments, bus 812 includes hardware, software, or both coupling components of computer system 800 to each other. As an example and not by way of limitation, bus 812 may include an Accelerated Graphics Port (AGP) or any other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 812 may include one or more buses 812, where appropriate. Although this disclosure describes and illustrates a particular bus, this disclosure contemplates any suitable bus or interconnect.

Herein, a computer-readable non-transitory storage medium or media may include one or more semiconductor-based or other types of integrated circuits (ICs) (such as field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed is:

1. A method comprising, by a computing system of a vehicle:
   generating perception data based on sensor data captured by one or more sensors of the vehicle that perceive a real-world, the perception data including one or more representations of physical objects in the real-world around the vehicle, wherein generating the perception data includes acquiring the perception data using the one or more sensors during a live test of the vehicle as the vehicle progresses along a road segment;
   determining simulated perception data that includes one or more representations of virtual objects that are to be simulated within an environment;
   generating, while the vehicle is in operation on the road segment as the vehicle is performing the live test, modified perception data based on the perception data and the simulated perception data, the modified perception data including at least one of the one or more representations of physical objects and the one or more representations of virtual objects; and
   determining a path of travel for the vehicle based on the modified perception data in real-time as the vehicle operates in the environment that is the real-world to perform a live test of automated systems of the vehicle and by considering the virtual objects depicted in the modified perception data.

2. The method of claim 1, wherein the simulated perception data comprise instructions to generate the modified perception data.

3. The method of claim 1, wherein the simulated perception data include information associated with the one or more representations of virtual objects.

4. The method of claim 3, wherein the information specifies a time and a location at which at least one of the one or more representations of virtual objects is to be placed in a second environment represented by the modified perception data.

5. The method of claim 4, wherein the information is based at least in part on a state of the vehicle or a state of at least one of the one or more representations of physical objects in the perception data.

6. The method of claim 1, wherein the simulated perception data are generated by a simulation editor.

7. The method of claim 1, wherein the simulated perception data are generated based on second sensor data captured at a time when the one or more representations of virtual objects correspond to one or more second physical objects in a second environment associated with the vehicle.

8. The method of claim 7, wherein the second sensor data are captured by the one or more sensors of the vehicle or one or more second sensors of another vehicle.

9. One or more computer-readable non-transitory storage media embodying instructions that is operable when executed by a computing system of a vehicle to:
   generate perception data based on sensor data captured by one or more sensors of the vehicle that perceive a real-world, the perception data including one or more representations of physical objects the real-world around the vehicle, wherein generating the perception data includes acquiring the perception data using the one or more sensors during a live test of the vehicle as the vehicle progresses along a road segment;
   determine simulated perception data that includes one or more representations of virtual objects that are to be simulated within an environment;
   generate, while the vehicle is in operation on the road segment as the vehicle is performing the live test, modified perception data based on the perception data and the simulated perception data, the modified perception data including at least one of the one or more representations of physical objects and the one or more representations of virtual objects; and
   determine a path of travel for the vehicle based on the modified perception data in real-time as the vehicle operates in the environment that is the real-world to perform a live test of automated systems of the vehicle and by considering the virtual objects depicted in the modified perception data.

10. The media of claim 9, wherein the simulated perception data comprise instructions to generate the modified perception data.

11. The media of claim 9, wherein the simulated perception data include information associated with the one or more representations of virtual objects, and wherein the instructions to generate the perception data include instructions to acquire the perception data using the one or more sensors during the live test of the vehicle as the vehicle progresses along a road segment.

12. The media of claim 11, wherein the information specifies a time and a location at which at least one of the one or more representations of virtual objects is to be placed in a second environment represented by the modified perception data.

13. The media of claim 12, wherein the information is based at least in part on a state of the vehicle or a state of at least one of the one or more representations of physical objects in the perception data.

14. The media of claim 9, wherein the simulated perception data are generated by a simulation editor.

15. A system of a vehicle, comprising:
one or more processors; and
one or more computer-readable non-transitory storage media coupled to the one or more processors and comprising instructions operable when executed by the one or more processors cause the system to:
generate perception data based on sensor data captured by one or more sensors of the vehicle that perceive a real-world, the perception data including one or more representations of physical objects the real-world around the vehicle, wherein generating the perception data includes acquiring the perception data using the one or more sensors during a live test of the vehicle as the vehicle progresses along a road segment;
determine simulated perception data that includes one or more representations of virtual objects that are to be simulated within an environment;
generate, while the vehicle is in operation on the road segment as the vehicle is performing the live test, modified perception data based on the perception data and the simulated perception data, the modified perception data including at least one of the one or more representations of physical objects and the one or more representations of virtual objects; and
determine a path of travel for the vehicle based on the modified perception data in real-time as the vehicle operates in the environment that is the real-world to perform a live test of automated systems of the vehicle and by considering the virtual objects depicted in the modified perception data.

16. The system of claim 15, wherein the simulated perception data comprise instructions to generate the modified perception data.

17. The system of claim 15, wherein the simulated perception data include information associated with the one or more representations of virtual objects, and wherein the instructions to generate the perception data include instructions to acquire the perception data using the one or more sensors during the live test of the vehicle as the vehicle progresses along a road segment.

18. The system of claim 17, wherein the information specifies a time and a location at which at least one of the one or more representations of virtual objects is to be placed in a second environment represented by the modified perception data.

19. The system of claim 18, wherein the information is based at least in part on a state of the vehicle or a state of at least one of the one or more representations of physical objects in the perception data.

20. The system of claim 15, wherein the simulated perception data are generated by a simulation editor.

* * * * *